(12) United States Patent
Jung et al.

(10) Patent No.: US 10,290,340 B1
(45) Date of Patent: May 14, 2019

(54) OFFSET-CANCELING (OC) WRITE OPERATION SENSING CIRCUITS FOR SENSING SWITCHING IN A MAGNETO-RESISTIVE RANDOM ACCESS MEMORY (MRAM) BIT CELL IN AN MRAM FOR A WRITE OPERATION

(71) Applicants: QUALCOMM Incorporated, San Diego, CA (US); Yonsei University, University-Industry Foundation, Seoul (KR)

(72) Inventors: Seong-Ook Jung, Seoul (KR); Sara Choi, Seoul (KR); Hong Keun Ahn, Seoul (KR); Seung Hyuk Kang, San Diego, CA (US); Sungryul Kim, San Diego, CA (US)

(73) Assignees: QUALCOMM Technologies, Incorporated, San Diego, CA (US); Yonsei University, University-Industry Foundation, Seoul (KR)

( * ) Notice: Subject to any disclaimer, the term of this patent is extended or adjusted under 35 U.S.C. 154(b) by 0 days.

(21) Appl. No.: 15/939,484

(22) Filed: Mar. 29, 2018

(51) Int. Cl.
G11C 11/16 (2006.01)
H01L 43/08 (2006.01)
G11C 7/06 (2006.01)

(52) U.S. Cl.
CPC ............ *G11C 11/1675* (2013.01); *G11C 7/06* (2013.01); *G11C 11/161* (2013.01);
(Continued)

(58) Field of Classification Search
CPC .................................... G11C 7/08; G11C 8/08
(Continued)

(56) References Cited

U.S. PATENT DOCUMENTS 6,473,349 B1 * 10/2002 Flannagan ............. G11C 7/065
365/205
8,848,423 B2 * 9/2014 Chung ................... G11C 17/18
365/148
(Continued)

OTHER PUBLICATIONS

Farkhani, Hooman et al., "STT-RAM Energy Reduction Using Self-Referenced Differential Write Termination Technique," IEEE Transactions on Very Large Scale Integration (VLSI) Systems, vol. 25, No. 2, Feb. 2017, pp. 476-487.
(Continued)

*Primary Examiner* — Michael T Tran
(74) *Attorney, Agent, or Firm* — W&T/Qualcomm

(57) ABSTRACT

Aspects disclosed in the detailed description include offset-canceling (OC) write operation sensing circuits for sensing switching in a magneto-resistive random access memory (MRAM) bit cell in an MRAM for a write operation. The OC write operation sensing circuit is configured to sense when MTJ switching occurs in MRAM bit cell. In an example, the OC write operation sensing circuit includes a voltage sensing circuit and a sense amplifier. The voltage sensing circuit employs a capacitive-coupling effect so that the output voltage drops in response to MTJ switching for both logic '0' and logic '1' write operations. The sense amplifier has a single input and a single output node with an output voltage indicating when MTJ switching has occurred in the MRAM bit cell. A single input transistor and pull-up transistor are provided in the sense amplifier in one example to provide an offset-canceling effect.

30 Claims, 18 Drawing Sheets

(52) U.S. Cl.
CPC ...... *G11C 11/1655* (2013.01); *G11C 11/1657* (2013.01); *G11C 11/1673* (2013.01); *H01L 43/08* (2013.01)

(58) Field of Classification Search
USPC .................................................. 365/154, 205
See application file for complete search history.

(56) References Cited

U.S. PATENT DOCUMENTS

| | | | | |
|---|---|---|---|---|
| 9,070,437 | B2* | 6/2015 | Chung | G11C 13/0002 |
| 9,196,337 | B2* | 11/2015 | Jung | G11C 11/1673 |
| 9,473,163 | B1* | 10/2016 | Tsai | H03M 1/466 |
| 9,818,478 | B2* | 11/2017 | Chung | G11C 13/0004 |
| 2003/0174574 | A1 | 9/2003 | Perner et al. | |
| 2004/0202014 | A1* | 10/2004 | Palmer | G11C 11/419 365/154 |
| 2005/0117424 | A1* | 6/2005 | Sung | G11C 7/065 365/205 |
| 2007/0159870 | A1 | 7/2007 | Tanizaki et al. | |
| 2009/0059686 | A1* | 3/2009 | Sung | G11C 7/08 365/189.11 |
| 2014/0075089 | A1 | 3/2014 | Bartling et al. | |
| 2015/0294706 | A1 | 10/2015 | Bonaccio et al. | |
| 2017/0084322 | A1 | 3/2017 | Wang et al. | |

OTHER PUBLICATIONS

Park, Jaeyoung et al., "Variation-Tolerant Write Completion Circuit for Variable-Energy Write STT-RAM Architecture," IEEE Transactions on Very Large Scale Integration (VLSI) Systems, vol. 24, No. 4, 2015, 10 pages.

Yoo, Sang-Min et al., "A 2.5-V 10-b 1200-MSample/s CMOS Pipelined ADC Based on Merged-Capacitor Switching," IEEE Transactions on Circuits and Systems II, Express Briefs, vol. 51, No. 5, May 2004, pp. 269-275.

* cited by examiner

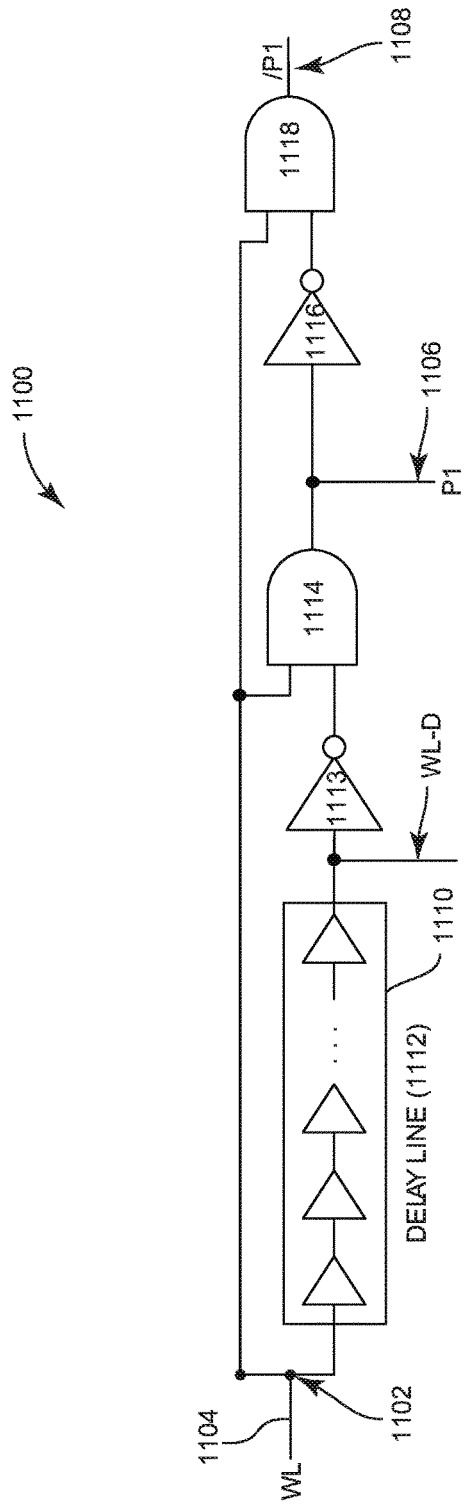
FIG. 11A
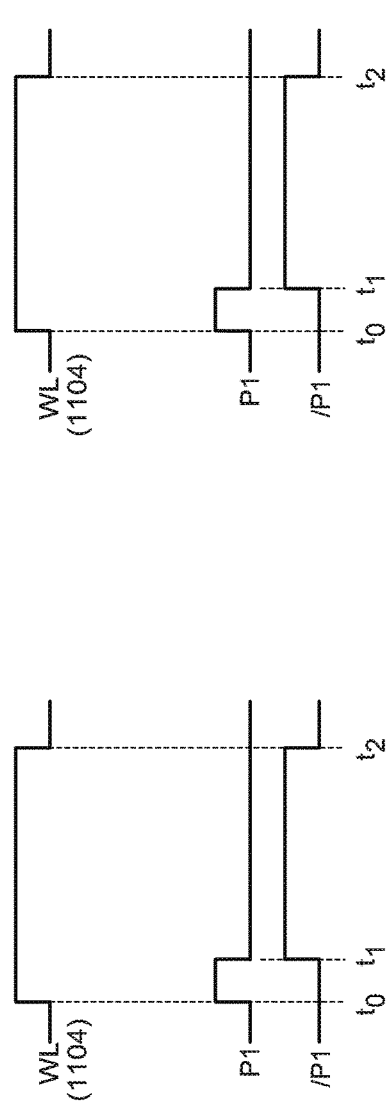
FIG. 11B
FIG. 11C

US 10,290,340 B1

OFFSET-CANCELING (OC) WRITE OPERATION SENSING CIRCUITS FOR SENSING SWITCHING IN A MAGNETO-RESISTIVE RANDOM ACCESS MEMORY (MRAM) BIT CELL IN AN MRAM FOR A WRITE OPERATION

BACKGROUND

I. Field of the Disclosure

The technology of the disclosure relates generally to magneto-resistive random access memory (MRAM) comprised of MRAM bit cells that include magnetic tunnel junctions (MTJs) for storing memory states as a function of programmed magnetic orientations, and more particularly to write operations to MRAM bit cells.

II. Background

Semiconductor storage devices are used in integrated circuits (ICs) in electronic devices to provide data storage. One example of a semiconductor storage device is static random access memory (SRAM). Conventional SRAM-based cache is very fast, but it has low density and expensive costs. To resolve the disadvantage of SRAM cache, magneto-resistive random access memory (MRAM) can be employed in memory to provide data storage. MRAM is non-volatile memory in which data is stored by programming a magnetic tunnel junction (MTJ) as part of an MRAM bit cell. One advantage of MRAM is that MTJs in MRAM bit cells can retain stored information even when power is turned off. This is because data is stored in the MTJ as a small magnetic element rather than as an electric charge or current. MRAM has high density characteristics and non-volatile features, which can be used in computer cache memory designs.

In this regard, an MTJ comprises a free ferromagnetic layer ("free layer") disposed above or below a fixed or pinned ferromagnetic layer ("pinned layer"). The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ according to the magnetic orientation between the free layer and the pinned layer. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical '0'). The magnetic orientations of the free and pinned layers can be sensed to read data stored in the MTJ by sensing a resistance when current flows through the MTJ. Data can also be written to and stored in the MTJ by applying a magnetic field to change the magnetic orientation of the free layer to either a P or AP magnetic orientation with respect to the pinned layer.

Recent developments in MTJ devices involve spin-transfer torque (STT)-MRAM devices. In STT-MRAM devices, the spin polarization of carrier electrons, rather than a pulse of a magnetic field, is used to program the state stored in the MTJ (i.e., a '0' or a '1'). In this regard, FIG. 1 illustrates an exemplary MRAM bit cell 100 that includes a metal-oxide semiconductor (MOS) (typically N-type MOS, i.e., NMOS) access transistor 102 integrated with an MTJ 104 for storing non-volatile data. The MRAM bit cell 100 may be provided in an MRAM memory used as memory storage for any type of system requiring electronic memory, such as a central processing unit (CPU) or processor-based system, as examples. The MTJ 104 includes a pinned layer 106 and a free layer 108 disposed on either side of a tunnel barrier 110 formed by a thin non-magnetic dielectric layer. When the magnetic orientations of the pinned and free layers 106, 108 are AP to each other, a first memory state exists (e.g., a logical '1'). When the magnetic orientations of the pinned and free layers 106, 108 are P to each other, a second memory state exists (e.g., a logical '0'). Further, the access transistor 102 controls reading and writing data to the MTJ 104. A drain D of the access transistor 102 is coupled to a bottom electrode 112 of the MTJ 104, which is coupled to the pinned layer 106. A word line 114 is coupled to a gate G of the access transistor 102. A source S of the access transistor 102 is coupled to a source line 116, which is coupled to a write driver circuit 118. A bit line 120 is coupled to the write driver circuit 118 and a top electrode 122 of the MTJ 104, which is coupled to the free layer 108.

With continuing reference to FIG. 1, to read data from the MRAM bit cell 100, a voltage differential is applied between the source line 116 and the bit line 120. The gate G of the access transistor 102 is activated by activating the word line 114 to create a circuit with a read driver circuit (not shown) to cause a read current $I_R$ to flow through the MTJ 104. The voltage is applied between the source line 116 and the bit line 120 such that the direction of the read current $I_R$ flows from the free layer 108 to the pinned layer 106. The read current $I_R$ is sensed as an indication of the resistance of the MTJ 104 indicating whether the free layer 108 is a P or AP magnetic orientation to the pinned layer 106, and hence whether the MTJ 104 stores a logic '0' or '1' value. When writing data to the MTJ 104, a larger voltage differential is applied between the source line 116 and the bit line 120 by the write driver circuit 118, and the gate G of the access transistor 102 is activated by activating the word line 114. This causes a write current $I_W$ larger than the read current $I_R$ to flow through the MTJ 104. The write current $I_W$ must be strong enough to change the magnetic orientation of the free layer 108. If the magnetic orientation is to be changed from an AP to P magnetic orientation, the write current $I_W$ flowing from the top electrode 122 to the bottom electrode 112 induces STT at the free layer 108 that can change the magnetic orientation of the free layer 108 to P with respect to the pinned layer 106. If the magnetic orientation is to be changed from P to AP, a current flowing from the bottom electrode 112 to the top electrode 122 induces STT at the free layer 108 to change the magnetic orientation of the free layer 108 to AP with respect to the pinned layer 106.

Thus, as discussed above, a feature of STT-MRAM is that it is a non-volatile memory that can retain stored data (i.e., magnetization state) without power. A lower current level is needed to read the data stored in the MTJ in an MRAM bit cell to avoid changing the magnetic orientation of the free layer in the MTJ. However, in write operations that write data in an MRAM bit cell, a higher level of current is required to change the magnetic orientation of the free layer in the MTJ. Thus, STT-MRAM requires larger dynamic energy during write operations than read operations. Even though the number of write operations performed to MRAM bit cells in an MRAM may be much lower than the number of read operations, the dynamic energy consumption of write operations is still significant enough to consume more power than may be desired for low power memory applications.

SUMMARY OF THE DISCLOSURE

Aspects disclosed in the detailed description include offset-canceling (OC) write operation sensing circuits for sensing switching in a magneto-resistive random access memory (MRAM) bit cell in an MRAM for a write operation. For example, an MRAM bit cell in the MRAM may include a magnetic tunnel junction (MTJ) that includes a free ferromagnetic layer having a free or non-pinned magnetization that can be switched in response to a write current generated for a write operation to the MTJ to store a memory state. Once the switching of the MTJ in the MRAM bit cell has completed in response to a write operation, the resistance of the MTJ will change since the resistance of the MTJ is a function of the magnetic orientation of the free layer in the MTJ. In response to the write operation, the OC write operation sensing circuit is configured to sense a voltage based on a voltage applied across the MTJ in the MRAM bit cell to generate a write current through the MTJ. The sensed voltage can be used to detect when the switching of an MTJ in the MRAM bit cell is completed. As an example, a write operation to the MRAM bit cell may be terminated when the MTJ switching is sensed to have discontinued applying a write current to the MTJ to conserve power.

In exemplary aspects disclosed herein, the OC write operation sensing circuit includes a voltage sensing circuit and a sense amplifier. The voltage sensing circuit is coupled to either a bit line BL or a source line SL as a sense line of the MRAM bit cell. In response to a write operation, the voltage sensing circuit is configured to sense a reference voltage on the sense line as a bit cell voltage in a pre-charge phase operation of the write operation before MTJ switching occurs. The voltage sensing circuit is also configured to sense a write operation voltage in a write operation phase of the write operation. Sensing the voltage on the sense line before MTJ switching occurs provides a reference voltage that can be compared to the sensed write operation voltage to detect when MTJ switching occurs in the MRAM bit cell. Sensing a reference voltage on the sense line, as opposed to using a fixed reference voltage, accounts for process and environmental variations in the MRAM bit cell. The sense amplifier in the OC write operation sensing circuit is configured to detect MTJ switching in the MRAM bit cell based on generating an output voltage representing a difference in voltage between a received voltage based on the sensed reference voltage in a pre-charge operation phase, to a voltage based on the sensed write operation voltage in the write operation phase. A write termination circuit may be provided and configured to generate a write enable signal based on the output voltage generated by the sense amplifier. For example, the write termination circuit may generate the write enable signal in a write disable state in response to an output voltage from the sense amplifier indicating that MTJ switching in the MRAM bit cell has occurred.

In further exemplary aspects disclosed herein, the voltage sensing circuit in the OC write operation sensing circuit employs a capacitive-coupling effect so that the sense output voltage drops in response to MTJ switching for both a logic '0' or logic '1' write operation to the MRAM bit cell. This allows the voltage sensing circuit to only be required to be coupled to one sense line of the MRAM bit cell (either the bit line BL or source line SL) to sense a change in voltage in response to MTJ switching, as opposed to more complicated circuits with increased transistor count and area configured to sense a voltage on both the bit line BL and source line SL of the MRAM bit cell. In this regard, the voltage sensing circuit includes an output node coupled to a sense amplifier input of the sense amplifier. The voltage sensing circuit includes a charge storage circuit (e.g., a capacitor) coupled between the sense line of the MRAM bit cell and the output node. The voltage sensing circuit also includes a pre-charge control circuit coupled to the output node. In the pre-charge operation phase, the pre-charge control circuit is configured to pre-charge the output node to a pre-charge voltage as an input voltage to the sense amplifier. The charge storage circuit is charged by a voltage differential of the bit cell voltage as a reference voltage on the sense line and the pre-charge voltage on the output node of the voltage sensing circuit. In a write operation phase, the pre-charge control circuit is disabled and the charge storage circuit keeps the pre-charge voltage on the output node. When the write operation voltage on the sense line changes in response to MTJ switching in the MRAM bit cell for either a logic '0' or '1' write operation, this voltage difference from the pre-charge voltage is transferred to the output node through a capacitive-coupling effect from the charge storage circuit as a drop in voltage. Thus, the voltage on the output node of the voltage sensing circuit drops from the pre-charge voltage to a reduced voltage in response to MTJ switching for both a logic '0' or '1' write operation. For example, the voltage on the bit line BL of the MRAM bit cell decreases for a logic '0' and '1' write operation, but decreases less in response to MTJ switching for a logic '0' write operation. However, the capacitive-coupling effect of the charge storage circuit causes the difference in drop in the output voltage between a logic '0' and '1' write operation to be reduced. This allows the sense amplifier to have a single input to reduce transistor count and associated area, because the input transistor of the sense amplifier will be prevented from operating in a sub-threshold region, thus being able to sense both MTJ switching for both logic '0' and '1' write operations with a single input and input transistor. In contrast, if the bit line BL of the MRAM bit cell were coupled directly to input of the sense amplifier without employing a capacitive-coupling effect in a logic '0' memory state, the reference voltage on the bit line BL of the MRAM bit cell may place the input transistor of the sense amplifier in its sub-threshold region. This would cause the sense amplifier to not properly sense MTJ switching for a logic '1' write operation.

In further exemplary aspects disclosed herein, the sense amplifier of the OC write operation sensing circuit is configured to generate an output voltage on a single output node indicating when MTJ switching has occurred in the MRAM bit cell based on the difference in the sensed reference and write operation voltages by the voltage sensing circuit. This reduces the transistor count and area of the sense amplifier. Also, with the sense amplifier having a single input and single output, the offset voltage of the sense amplifier is lowered. For example, in a differential sense amplifier, the differences in threshold voltage of input transistors contribute to an offset voltage in the differential sense amplifier. In this regard, in one example, the sense amplifier includes an input transistor that includes a gate as a sense amplifier input of the sense amplifier coupled to the output node of the voltage sensing circuit. The source and drain of the input transistor are coupled to a write enable transistor coupled to a ground node and a first output node. A pull-up transistor is coupled between a supply voltage rail and the first output node. A second charge storage circuit is coupled to a gate G of the pull-up transistor. A second reference voltage is applied to the gate G of the pull-up transistor and charges the second charge storage circuit to the second reference voltage. In the pre-charge operation phase, the pre-charge voltage from the voltage sensing circuit is applied to the gate G of the input transistor. A pass-gate diode connects the gate G of the pull-up transistor to the first output node such that the second reference voltage is at the first output node. An inverter circuit is coupled to the first output node. The second reference voltage is not high enough to activate the inverter circuit. The pre-charge voltage from the voltage sensing circuit coupled to a gate G of the input transistor is above the sub-threshold voltage for the input transistor to keep the input transistor out of it sub-threshold region. The second reference voltage coupled to the gate G of the pull-up transistor is above the sub-threshold voltage for the pull-up transistor to keep the pull-up transistor out of its sub-threshold region. Further, the sense amplifier has an offset-canceling effect by providing a single input transistor and single pull-up transistor such that no offset voltages are present like in a differential transistor arrangement. In the write operation phase, the pass gate is opened. In response to the MTJ switching in the MRAM bit cell, the output voltage from the voltage sensing circuit drops, causing the input voltage on the gate G of the input transistor to drop, but still above its threshold voltage. However, the reduction in the input voltage reduces the current of the input transistor thus causing the output voltage on the first output node to increase in voltage above the second reference voltage through the pull-up transistor. The increase in the output voltage on the first output node is sufficient to activate the inverter circuit to invert the output voltage on a second output node. For example, the voltage drop on the second output node can be used to generate a write enable signal in a write disable state to terminate a write operation for the MRAM bit cell, if desired.

In this regard in one aspect, a write operation sensing circuit for sensing MTJ switching in an MRAM bit cell in response to a write operation is provided. The write operation sensing circuit comprises a voltage sensing circuit. The voltage sensing circuit comprises a voltage sensing input configured to be coupled to a sense line of an MRAM bit cell, the voltage sensing input configured to receive a bit cell voltage on the sense line. The voltage sensing circuit also comprises a voltage sensing output coupled to a sense amplifier input of a sense amplifier, the voltage sensing output configured to receive a sense output voltage. The voltage sensing circuit also comprises a charge storage circuit coupled to the voltage sensing input and the voltage sensing output. The voltage sensing circuit also comprises a pre-charge control circuit coupled to the voltage sensing output and a pre-charge voltage input configured to receive a pre-charge voltage. The write operation sensing circuit also comprises the sense amplifier. The sense amplifier comprises the sense amplifier input, and a first sense amplifier output configured to receive a first sense amplifier output voltage. The sense amplifier also comprises an input control circuit coupled to the sense amplifier input and the first sense amplifier output, the input control circuit configured to receive the sense output voltage. The sense amplifier also comprises a pull-up control circuit coupled to a reference voltage input configured to receive a sense amplifier reference voltage, a supply voltage rail configured to receive a supply voltage, and the first sense amplifier output. The sense amplifier also comprises a second charge storage circuit coupled to the reference voltage input. The sense amplifier also comprises a second pre-charge control circuit coupled to a gate of the pull-up control circuit and the reference voltage input.

In another aspect, a write operation sensing circuit for sensing MTJ switching in an MRAM bit cell in response to a write operation is provided. The write operation sensing circuit comprises a means for pre-charging a voltage sensing output of a voltage sensing circuit to a pre-charge voltage, the voltage sensing output coupled to a charge storage circuit, and wherein the charge storage circuit is coupled to a sense line of an MRAM bit cell having a bit cell voltage, in response to a write operation signal indicating a pre-charge operation phase for a write operation to the MRAM bit cell. The write operation sensing circuit also comprises a means for storing a differential voltage between the pre-charge voltage and the bit cell voltage as a first reference voltage, in response to the write operation signal indicating the pre-charge operation phase. The write operation sensing circuit also comprises a means for coupling the pre-charge voltage on the voltage sensing output to an input control circuit of a sense amplifier to cause the input control circuit to be activated outside its sub-threshold region, in response to the write operation signal indicating the pre-charge operation phase. The write operation sensing circuit also comprises a means for pre-charging a first sense amplifier output of the sense amplifier to a sense amplifier reference voltage, in response to the write operation signal indicating the pre-charge operation phase. The write operation sensing circuit also comprises a means for discontinuing the means for pre-charging the voltage sensing output to the pre-charge voltage, in response to the write operation signal indicating a write operation phase for the write operation to the MRAM bit cell. The write operation sensing circuit also comprises a means for capacitively coupling the charge storage circuit to a sense output voltage to decrease the pre-charge voltage on the voltage sensing output in response to a decrease in the bit cell voltage on the sense line in response to a memory state switching in the MRAM bit cell for the write operation, in response to the write operation signal indicating the write operation phase. The write operation sensing circuit also comprises a means for discontinuing the means for pre-charging the first sense amplifier output of the sense amplifier to the sense amplifier reference voltage, in response to the write operation signal indicating the write operation phase. The write operation sensing circuit also comprises a means for coupling a supply voltage rail configured to receive a supply voltage to the first sense amplifier output to divide the supply voltage with the input control circuit to generate the first sense amplifier output voltage on the first sense amplifier output in response to the write operation signal indicating the write operation phase, wherein a voltage level of the first sense amplifier output voltage on the first sense amplifier output indicates whether the memory state in the MRAM bit cell has switched for the write operation.

In another aspect, a method of sensing MTJ switching in an MRAM bit cell in response to a write operation is provided. In response to a write operation signal indicating a pre-charge operation phase for a write operation to an MRAM bit cell, the method comprises pre-charging a voltage sensing output of a voltage sensing circuit to a pre-charge voltage, the voltage sensing output coupled to a charge storage circuit, and wherein the charge storage circuit is coupled to a sense line of the MRAM bit cell having a bit cell voltage, storing a differential voltage between the pre-charge voltage and the bit cell voltage as a first reference voltage in the charge storage circuit, coupling the pre-charge voltage on the voltage sensing output to an input control circuit of a sense amplifier to cause the input control circuit to be activated outside its sub-threshold region, and pre-charging a first sense amplifier output of the sense amplifier to a sense amplifier reference voltage. In response to the write operation signal indicating a write operation phase for the write operation to the MRAM bit cell, the method comprises decoupling a pre-charge control circuit from the voltage sensing output, capacitively coupling the charge storage circuit to a sense output voltage to decrease the pre-charge voltage on the voltage sensing output in response to a decrease in the bit cell voltage on the sense line in response to a memory state switching in the MRAM bit cell for the write operation, discontinuing pre-charging of the first sense amplifier output of the sense amplifier to the sense amplifier reference voltage, and coupling a supply voltage rail configured to receive a supply voltage to the first sense amplifier output to divide the supply voltage with the input control circuit to generate the first sense amplifier output voltage on the first sense amplifier output, wherein a voltage level of the first sense amplifier output voltage on the first sense amplifier output indicates whether the memory state in the MRAM bit cell has switched for the write operation.

In another aspect, an MRAM is provided. The MRAM comprises a plurality of MRAM bit cells each comprising an access transistor comprising a gate node coupled to a word line, a first access node and a second access node coupled to a source line, an MTJ coupled between a bit line and the first access node of the access transistor, and a plurality of write operation sensing circuits each coupled to an MRAM bit cell among the plurality of MRAM bit cells. Each write operation sensing circuit among the plurality of write operation sensing circuits comprises a voltage sensing circuit. The voltage sensing circuit comprises a voltage sensing input configured to be coupled to a sense line of the MRAM bit cell, the voltage sensing input configured to receive a bit cell voltage on the sense line. The voltage sensing circuit also comprises a voltage sensing output coupled to a sense amplifier input of a sense amplifier, the voltage sensing output configured to receive a sense output voltage. The voltage sensing circuit also comprises a charge storage circuit coupled to the voltage sensing input and the voltage sensing output. The voltage sensing circuit also comprises a pre-charge control circuit coupled to the voltage sensing output and a pre-charge voltage input configured to receive a pre-charge voltage. Each write operation sensing circuit among the plurality of write operation sensing circuits comprises also comprises the sense amplifier. The sense amplifier comprises the sense amplifier input, and a first sense amplifier output configured to receive a first sense amplifier output voltage. The sense amplifier also comprises an input control circuit coupled to the sense amplifier input and the first sense amplifier output, the input control circuit configured to receive the sense output voltage. The sense amplifier also comprises a pull-up control circuit coupled to a reference voltage input configured to receive a sense amplifier reference voltage, a supply voltage rail configured to receive a supply voltage, and the first sense amplifier output. The sense amplifier also comprises a second charge storage circuit coupled to the reference voltage input. The sense amplifier also comprises a second pre-charge control circuit coupled to a gate of the pull-up control circuit and the reference voltage input.

BRIEF DESCRIPTION OF THE FIGURES

FIG. 11A is a schematic diagram of an exemplary phase control circuit for generating pre-charge phase signals that control the pre-charge and write operation phases of the OC write operation sensing circuit in FIG. 5A, in response to a write operation;

FIGS. 11B and 11C are timing diagrams illustrating exemplary timing for pre-charge operation phases and write operation phases of the OC write operation sensing circuit in FIG. 5A to detect MTJ switching in the MRAM bit cell in response to a write operation;

DETAILED DESCRIPTION

Figure 1:
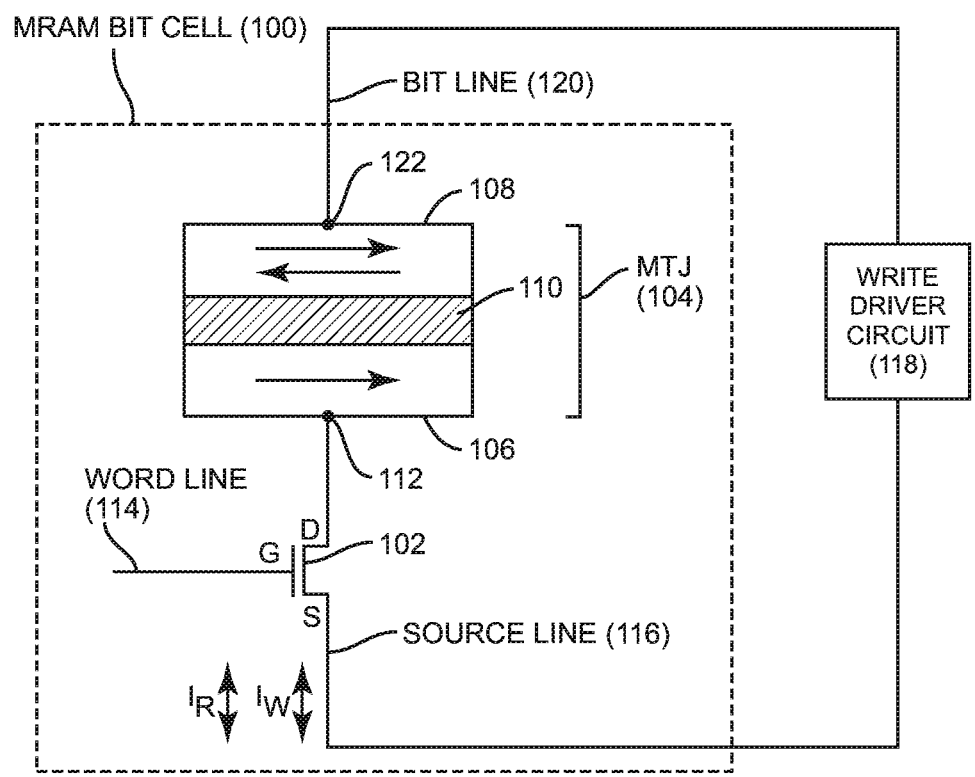
FIG. 1 is a diagram of an exemplary magneto-resistive random access memory (MRAM) bit cell employing a magnetic tunnel junction (MTJ)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include offset-canceling (OC) write operation sensing circuits for sensing switching in a magneto-resistive random access memory (MRAM) bit cell in an MRAM for a write operation. For example, an MRAM bit cell in the MRAM may include a magnetic tunnel junction (MTJ) that includes a free ferromagnetic layer having a free or non-pinned magnetization that can be switched in response to a write current generated for a write operation to the MTJ to store a memory state. Once the switching of the MTJ in the MRAM bit cell has completed in response to a write operation, the resistance of the MTJ will change since the resistance of the MTJ is a function of the magnetic orientation of the free layer in the MTJ. In response to the write operation, the OC write operation sensing circuit is configured to sense a voltage based on a voltage applied across the MTJ in the MRAM bit cell to generate a write current through the MTJ. The sensed voltage can be used to detect when the switching of an MTJ in the MRAM bit cell is completed. As an example, a write operation to the MRAM bit cell may be terminated when the MTJ switching is sensed to have discontinued applying a write current to the MTJ to conserve power.

In exemplary aspects disclosed herein, the OC write operation sensing circuit includes a voltage sensing circuit and a sense amplifier. The voltage sensing circuit is coupled to either a bit line BL or a source line SL as a sense line of the MRAM bit cell. In response to a write operation, the voltage sensing circuit is configured to sense a reference voltage on the sense line as a bit cell voltage in a pre-charge phase operation of the write operation before MTJ switching occurs. The voltage sensing circuit is also configured to sense a write operation voltage in a write operation phase of the write operation. Sensing the voltage on the sense line before MTJ switching occurs provides a reference voltage that can be compared to the sensed write operation voltage to detect when MTJ switching occurs in the MRAM bit cell. Sensing a reference voltage on the sense line, as opposed to using a fixed reference voltage, accounts for process and environmental variations in the MRAM bit cell. The sense amplifier in the OC write operation sensing circuit is configured to detect MTJ switching in the MRAM bit cell based on generating an output voltage representing a difference in voltage between a received voltage based on the sensed reference voltage in a pre-charge operation phase, to a voltage based on the sensed write operation voltage in the write operation phase. A write termination circuit may be provided and configured to generate a write enable signal based on the output voltage generated by the sense amplifier. For example, the write termination circuit may generate the write enable signal in a write disable state in response to an output voltage from the sense amplifier indicating that MTJ switching in the MRAM bit cell has occurred.

Figure 2:
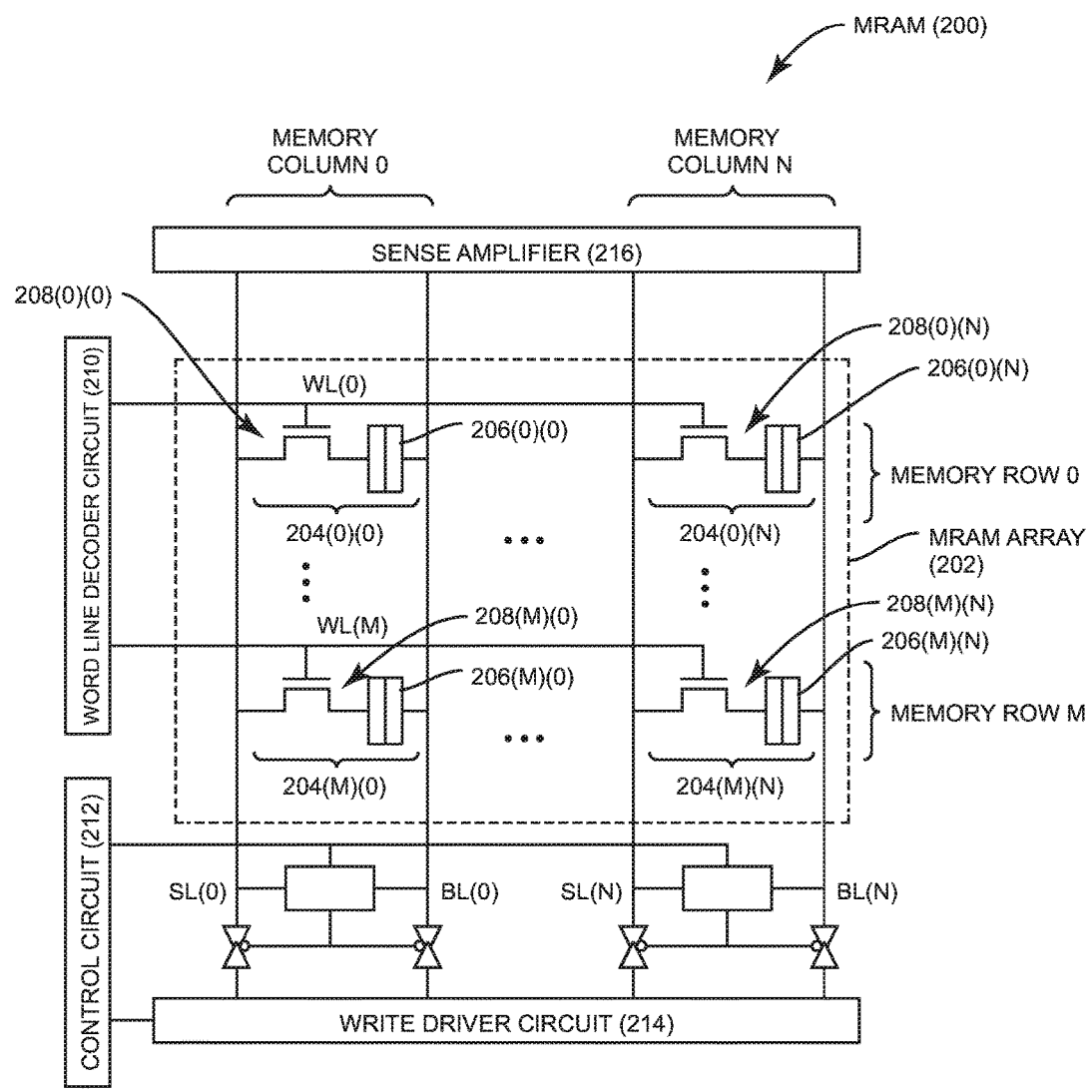
FIG. 2 is a schematic diagram of an exemplary MRAM that includes an MRAM array comprising a plurality of MRAM bit cells organized in rows and columns and supporting access circuitry for accessing the MRAM bit cells, and further including a sensing circuit coupled to each MRAM bit cell for sensing and comparing a reference voltage and write operation voltage of the MRAM bit cell to detect MTJ switching in the MRAM bit cell.

In this regard, FIG. 2 illustrates an exemplary MRAM 200 that includes an MRAM array 202 that includes a plurality of MRAM bit cells 204(0)(0)-204(M)(N) organized in memory rows 0-M and memory columns 0-N. In this example, each MRAM bit cell 204(0)(0)-204(M)(N) includes an MTJ 206(0)(0)-206(M)(N) coupled to an access transistor 208(0)(0)-208(M)(N). The access transistors 208(0)(0)-208(M)(N) for each MRAM bit cell 204(0)(0)-204(M)(N) are coupled to respective word lines WL(0)-WL(M) that are associated with a respective memory row 0-M. A word line decoder circuit 210 is provided in the MRAM 200 and is configured to decode a memory address for a memory read or write operation to assert a word line signal on the word line WL(0)-WL(M) associated with the memory row 0-M of the memory address to activate the MRAM bit cells 204(0)(0)-204(M)(N) in the selected memory row 0-M for the write operation. When a memory row 0-M of the MRAM bit cells 204(0)0-204(M)( ) is selected by the word line decoder circuit 210, the MTJs 206(0)0-206(M)( ) of the MRAM bit cells 204(0)0-204(M)0 in the selected memory row 0-M are coupled between a respective source line SL(0)-SL(N) and a bit line BL(0)-BL(N) in the memory columns 0-N.

With continuing reference to FIG. 2, for a write operation, a control circuit 212 controls a write driver circuit 214 based on the memory access being in a write operation to assert a write operation voltage differential between the source lines SL(0)-SL(N) and their corresponding bit lines BL(0)-BL(N) according to the memory state to be written to the respective MTJs 206( )(0)-206( )(N) in the selected memory row 0-M. This causes a respective write current to flow through the respective MTJs 206( )(0)-206( )(N) in the selected memory row 0-M between the respective source lines SL(0)-SL(N) and bit lines BL(0)-BL(N) to switch the magnetic orientation (i.e., direction) of the free layers to store the memory state to be written according to the write operation. The magnetic orientation of the free layers can be switched to be parallel (P) or anti-parallel (AP) to the magnetic orientation of the pinned layers of respective MTJs 206( )(0)-206( )(N) to represent logic '0' and '1', respectively. The polarity of a write differential voltage between the respective source lines SL(0)-SL(N) and bit lines BL(0)-BL(N) controls the direction of the write current and whether the respective MTJs 206( )(0)-206( )(N) in the selected memory row 0-M are switched to a P or AP memory state. As will be discussed in more detail below, the voltage at either the source lines SL(0)-SL(N) or bit lines BL(0)-BL(N) of the selected MRAM bit cells 204(0)(0)-204(M)(N) in the MRAM 200 that is supplied by a supply voltage rail can be sensed for tracking write operations to the MRAM bit cells 204(0)(0)-204(M)(N) to in turn cause the write driver circuit 214 to de-assert or discontinue applying the write operation voltage differential between the source lines SL(0)-SL(N) and their corresponding bit lines BL(0)-BL(N) for the write operation to reduce dynamic power consumption and average write times.

For a read operation, a sense amplifier 216 asserts a read voltage differential between the source lines SL(0)-SL(N) and their corresponding bit lines BL(0)-BL(N) of the respective MTJs 206( )(0)-206( )(N) in the selected memory row 0-M to be read. This causes a respective read current to flow through the respective MTJs 206( )(0)-206( )(N) in the selected memory row 0-M between the respective source lines SL(0)-SL(N) and bit lines BL(0)-BL(N) according to the resistance of the respective MTJs 206( )(0)-206( )(N), which is dependent on magnetic orientation (i.e., direction) of the free layers therein representing a stored memory state. The read voltage differential is less than the write operation voltage differential so that a read current is not generated that is able to switch the magnetic orientation of the free layers of the MTJs 206( )(0)-206( )(N) in the selected memory row 0-M. The sense amplifier 216 senses the read current as a way to determine the resistance of the respective MTJs 206( )(0)-206( )(N) in the selected memory row 0-M for the read operation, and thus the memory state stored in the MTJs 206( )(0)-206( )(N).

Figure 3:
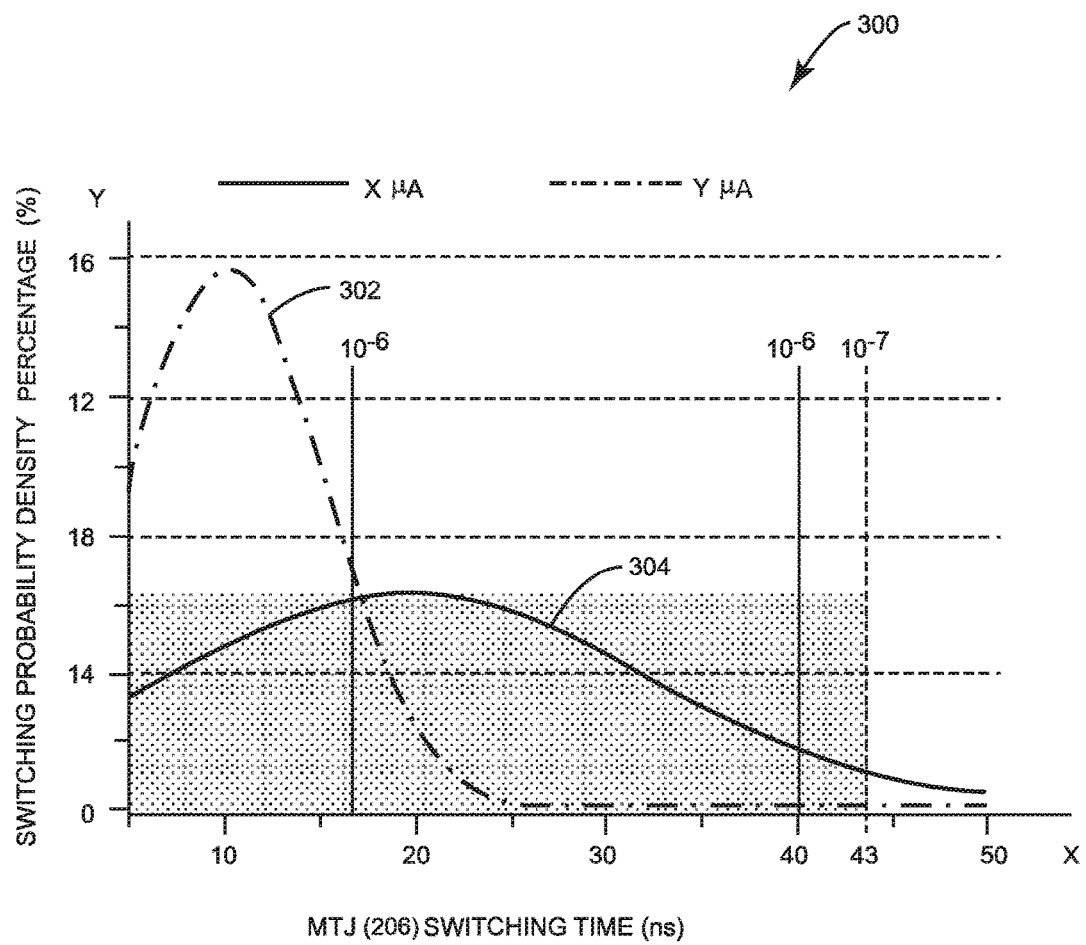
FIG. 3 is a graph illustrating an exemplary MTJ switching time distribution of an exemplary MTJ in the MRAM bit cell in the MRAM in FIG. 2 for a write operation.

FIG. 3 is a graph 300 illustrating an exemplary switching time distribution of the MTJs 206(0)(0)-206(M)(N) in the MRAM bit cells 204(0)(0)-204(M)(N) in the MRAM 200 in FIG. 2 for a write operation. As shown therein, the X-axis plots the MTJ switching time in nanoseconds (ns). The Y-axis plots the switching probability density percentage (%) for a given MTJ switching time. As shown therein, the MTJ switching time is not the same for a given MTJ 206(0)(0)-206(M)(N), but rather the MTJ switching time is a probability distribution. For example, curve 302 shows the MTJ switching time distribution for a write current of X microAmps (µA), and curve 304 shows the MTJ switching time distribution for a write current of Y microAmps (µA), which is less than X µA. Thus, to achieve a worst case write failure probability of $10^{-7}$, meaning that the failure rate of switching of the magnetic orientation of the MTJs 206(0)(0)-206(M)(N) is $10^{-7}$, the write time in this example must be at least 43 ns. However, most write operations to the MTJs 206(0)(0)-206(M)(N) can switch the magnetic orientation of the MTJs 206(0)(0)-206(M)(N) in less than 43 ns. Thus, if the write driver circuit 214 in the MRAM 200 in FIG. 2 is configured for a write time of 43 ns in this example to achieve a failure rate of $10^{-7}$, additional write time is required and additional power will be consumed for most write operations where the magnetic orientations of written MTJs 206(0)(0)-206(M)(N) are switched in less than 43 ns for a write operation. If a write operation can be terminated right after the switching of the magnetic orientations of written MTJs 206(0)(0)-206(M)(N), average write time and energy consumption can be reduced.

To detect the end of a write operation to selected MRAM bit cells 204(0)(0)-204(M)(N) for the write operation, the voltage on bit lines BL(0)-BL(N) of the written MRAM bit cells 204(0)(0)-204(M)(N) in the MRAM 200 in FIG. 2 can be sensed to track write operations to the MRAM bit cells 204(0)(0)-204(M)(N). The end of a write operation to the written MRAM bit cells 204(0)(0)-204(M)(N) can be detected by sensing the voltage at the bit lines BL(0)-BL(N) as a method of determining the change in resistance of the written MRAM bit cells 204(0)(0)-204(M)(N). This is because the change in resistance occurs in the MRAM bit cells 204(0)(0)-204(M)(N) after the magnetic orientations of their respective MTJs 206(0)(0)-206(M)(N) switch magnetic orientation. The resistance of a written MTJ 206(0)(0)-206(M)(N) will change since the resistance of the MTJ 206(0)(0)-206(M)(N) is a function of the magnetic orientation of the free layer in the MTJ 206(0)(0)-206(M)(N). As an example, the detected completion of a write operation to MRAM bit cells 204(0)(0)-204(M)(N) can then be used to terminate the write operation to reduce dynamic power consumption and average write times.

Figure 4A:
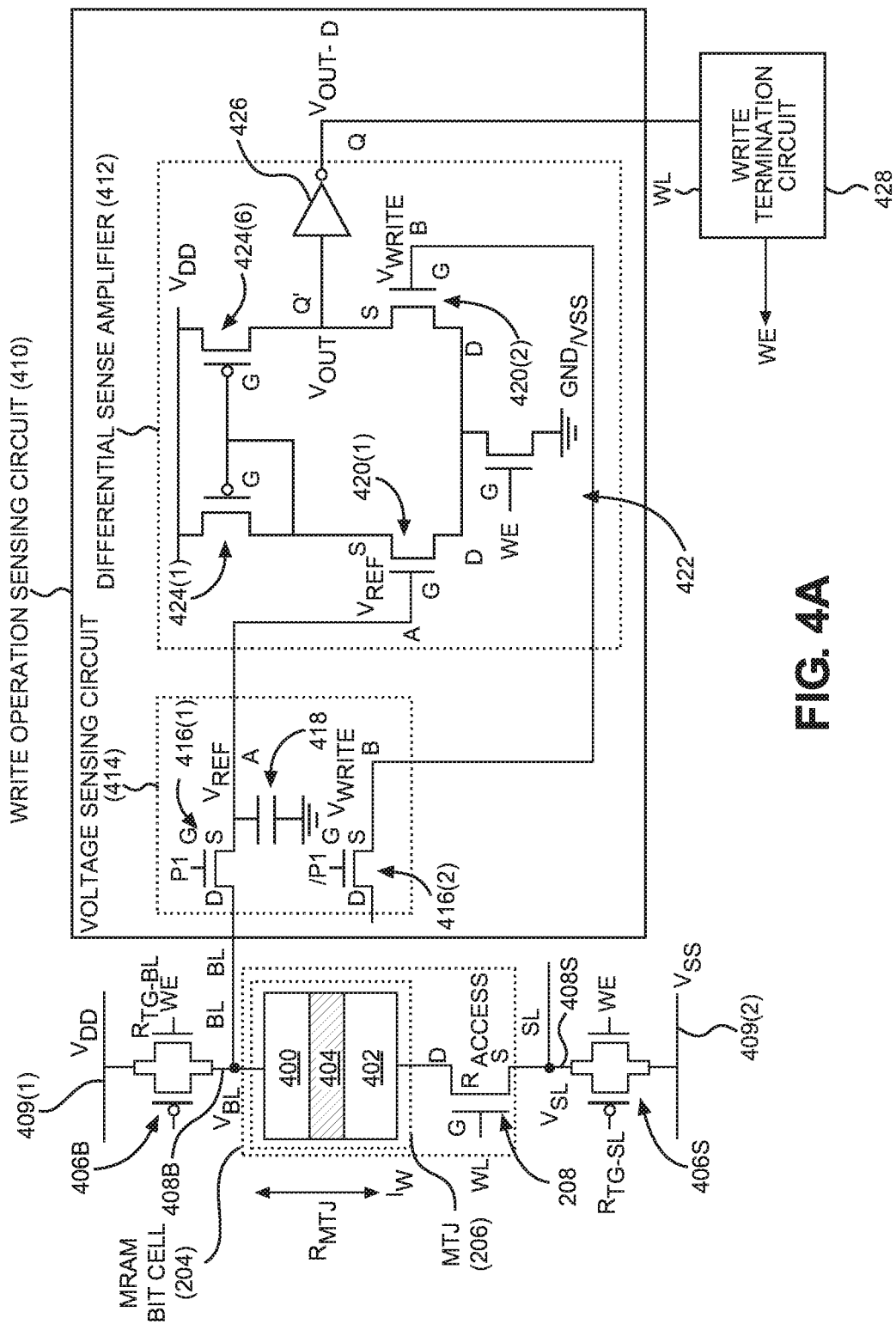
FIG. 4A is a schematic diagram of an exemplary MRAM bit cell of the MRAM array in FIG. 2 coupled to a write operation sensing circuit that includes a voltage sensing circuit configured to sense a voltage on a bit line BL in the MRAM bit cell, and a sense amplifier configured to generate an output voltage indicating the switching of an MTJ in the MRAM bit cell based on the sensed voltage by the voltage sensing circuit.

In this regard, FIG. 4A is a schematic diagram of an exemplary MRAM bit cell 204 that can be included in the MRAM array 202 in the MRAM 200 in FIG. 2. The MRAM bit cell 204 includes an MTJ 206. The MTJ 206 in this example includes a free layer 400 and a pinned layer 402 separated by a dielectric tunnel barrier 404 ("tunnel barrier 404"). The free layer 400 can be a ferromagnetic material whose magnetic moment (i.e., magnetic orientation) can be changed by a write current $I_W$ flowing through the MRAM bit cell 204. The pinned layer 402 can be a ferromagnetic material whose magnetic moment (i.e., magnetic orientation) is pinned or fixed and thus is not affected by the write current $I_W$ flowing through the MRAM bit cell 204. The tunnel barrier 404 is a dielectric material, such as magnesium oxide (MgO) for example, to provide a tunnel magneto-resistance (TMR). A first access node as a drain node D of an access transistor 208 is coupled to the MTJ 206, and to the pinned layer 402 (or through an electrode coupled to the pinned layer 402) in this particular example. However, note that the pinned layer 402 and free layer 400 could be reversed and the access transistor 208 could be coupled to the free layer 400 (or through an electrode coupled to the free layer 400). Also in this example, a second access node as a source node S of the access transistor 208 is coupled to a source line SL. A gate node G of the access transistor 208 is coupled to a word line WL. The access transistor 208 is shown in FIG. 4A as an NMOS transistor, but could be provided as a PMOS transistor as another example. Bit line and source line pass gates 406B, 406S are provided and coupled to the respective bit line BL and source line SL to control application of a voltage applied to respective bit line and source line voltage rails 408B, 408S coupled to the MRAM bit cell 204.

To write a logic '0' to the MRAM bit cell 204 in this example, a voltage is applied on the word line WL and the gate node G sufficient to activate the access transistor 208. The bit line and source line pass gates 406B, 406S are activated to provide a current path between the bit line BL and the source line SL. A supply voltage $V_{DD}$ on a supply voltage rail 409(1) sources a bit line voltage $V_{BL}$ applied to the bit line voltage rail 408B, and voltage $V_{SS}$ on a ground voltage rail 409(2) sources a source line voltage $V_{SL}$ applied to the source line voltage rail 408S as a negative or return voltage rail. Thus, the bit line voltage $V_{BL}$ at the bit line voltage rail 408B is a positive voltage with respect to the source line voltage $V_{SL}$ at the source line voltage rail 408S. The positive bit line voltage $V_{BL}$ applied to the bit line voltage rail 408B causes the write current $I_W$ to flow from the bit line BL to the source line SL. The supply voltage $V_{DD}$ is high enough to cause the bit line voltage $V_{BL}$ to be large enough to generate a large enough write current $I_W$ to cause the magnetic orientation of the free layer 400 of the MTJ 206 of the MRAM bit cell 204 to switch to a P magnetic orientation with respect to the pinned layer 402 in this example. On the other hand, to write a logic '1' to the MRAM bit cell 204, the access transistor 208 is again activated, and the bit line and source line pass gates 406B, 406S are activated. However in this case, the supply voltage $V_{DD}$ is applied to the ground voltage rail 409(2) to source the source line voltage $V_{SL}$ at the source line voltage rail 408S instead of the bit line voltage rail 408B to apply a positive supply voltage on the source line voltage rail 408S with respect to the bit line voltage rail 408B. The bit line voltage rail 408B has a negative voltage based on a negative supply voltage $V_{SS}$ as the negative or return voltage rail. The source line voltage $V_{SL}$ on the source line voltage rail 408S causes the write current $I_W$ to flow from the source line SL to the bit line BL. The supply voltage $V_{DD}$ is applied to cause the positive source line voltage $V_{SL}$ to be large enough to generate a large enough write current $I_W$ to switch the magnetic orientation of the free layer 400 of the MTJ 206 of the MRAM bit cell 204 to an AP magnetic orientation with respect to the pinned layer 402 in this example.

Formulas (1) and (2) below show the bit line voltage $V_{BL}$ and source line voltage $V_{SL}$ for a logic '0' write operation. Formulas (3) and (4) below show the bit line voltage $V_{BL}$ and source line voltage $V_{SL}$ for a logic '1' write operation. $R_{MTJ}$ is the resistance of the MTJ 206. $R_{ACCESS}$ is the resistance of the access transistor 208. $R_{TG-SL}$ is the resistance of the source line pass gate 406S. $R_{TG-BL}$ is the resistance of the bit line pass gate 406B.

$$V_{BL} = \frac{R_{MTJ} + R_{ACCESS} + R_{TG-SL}}{R_{TG-SL} + R_{MTJ} + R_{ACCESS} + R_{TG-BL}} V_{DD} \quad (1)$$

$$V_{SL} = \frac{R_{TG-SL}}{R_{TG-SL} + R_{MTJ} + R_{ACCESS} + R_{TG-BL}} V_{DD} \quad (2)$$

$$V_{BL} = \frac{R_{TG-BL}}{R_{TG-SL} + R_{MTJ} + R_{ACCESS} + R_{TG-BL}} V_{DD} \quad (3)$$

$$V_{SL} = \frac{R_{ACCESS} + R_{MTJ} + R_{TG-BL}}{R_{TG-SL} + R_{MTJ} + R_{ACCESS} + R_{TG-BL}} V_{DD} \quad (4)$$

For a logic '0' write operation, the MTJ 206 resistance $R_{MTJ}$ of the MTJ 206 is decreased. As shown above in formulas (1) and (2) for the bit line voltage $V_{BL}$ and source line voltage $V_{SL}$ respectively, for a logic '0' write operation, since the effect of this decrease in MTJ 206 resistance $R_{MTJ}$ is higher in the numerator than in the denominator of equation (1), the bit line voltage $V_{BL}$ decreases. However, the source line voltage $V_{SL}$ increases since the MTJ 206 resistance $R_{MTJ}$ in the denominator of equation (2) decreases. Thus, sensing the bit line voltage $V_{BL}$ for a logic '0' write operation results in a greater sensing margin for a differential sense amplifier 412 than sensing the source line voltage $V_{SL}$.

On the other hand, for a logic '1' write operation, the MTJ 206 resistance $R_{MTJ}$ is increased. As shown above in formulas (3) and (4) for the bit line voltage $V_{BL}$ and source line voltage $V_{SL}$ respectively for a logic '1' write operation, since the effect of this increase in MTJ 206 resistance $R_{MTJ}$ is higher in the numerator than in the denominator of equation (4), the source line voltage $V_{SL}$ increases. However, the bit line voltage $V_{BL}$ decreases since the MTJ 206 resistance $R_{MTJ}$ in the denominator of equation (3) increases. Thus, sensing the bit line voltage $V_{BL}$ for a logic '1' write operation results in a reduced sensing margin for the differential sense amplifier 412 in an undesired manner.

As will be discussed in more detail below starting at FIG. 5A, an OC write operation sensing circuit can be provided in the MRAM 200 in FIG. 2 to sense the voltage at a bit line BL in an MRAM bit cell 204(0)(0)-204(M)(N) in response to a write operation to detect when the MTJ 206 in the MRAM bit cell 204(0)(0)-204(M)(N) switches magnetic orientation (i.e., memory state). This sensed voltage can be used to determine when the MTJ 206 in the MRAM bit cell 204(0)(0)-204(M)(N) has a switched magnetic orientation to then cause the write operation to be terminated to conserve write energy. In this regard, the OC write operation sensing circuit includes a voltage sensing circuit coupled to an MRAM bit cell 204(0)(0)-204(M)(N) and a sense amplifier coupled to the voltage sensing circuit. The voltage sensing circuit employs a capacitive-coupling effect so that the output voltage drops in response to MTJ 206 switching for both logic '0' and logic '1' write operations. The sense amplifier has a single input and a single output node with an output voltage indicating when MTJ 206 switching has occurred in the MRAM bit cell 204(0)(0)-204(M)(N). An input transistor and pull-up transistor in the sense amplifier are kept above their sub-threshold voltages to provide an offset-canceling effect. However, before discussing an OC write operation sensing circuit that has a single input voltage and single output voltage, and has capacitive-coupling and OC features discussed above starting at FIG. 5A, a write operation sensing circuit 410 in FIG. 4A that does not include these features is first further described below.

In this regard, FIG. 4A further illustrates the write operation sensing circuit 410 that is configured to sense a voltage at the bit line BL to track write operations to the MRAM bit cell 204. The sensed voltage at the bit line BL can be used to detect the end of a write operation to the MRAM bit cell 204. In this regard, the write operation sensing circuit 410 may be provided for each MRAM bit cell 204(0)(0)-204(M) (N) in the MRAM array 202 in FIG. 2 as one example. In another example, a plurality of write operation sensing circuits 410 may be provided for each memory column 0-N in the MRAM array 202 in FIG. 2, where the write operation sensing circuits 410 are configured to sense voltage at a common bit line BL of the MRAM bit cells 204(0)0-204( )(N) in a selected memory row 0-M to be written.

With continuing reference to FIG. 4A, the write operation sensing circuit 410 includes the differential sense amplifier 412 and a voltage sensing circuit 414. The voltage sensing circuit 414 senses a bit line voltage $V_{BL}$ on the bit line BL of an MRAM bit cell 204(0)(0)-204(M)(N). As discussed below, the bit line voltage $V_{BL}$ will change when the MTJ 206 in the coupled MRAM bit cells 204(0)(0)-204(M)(N) switches its memory state in response to a write operation. The differential sense amplifier 412 is configured sense a difference between a reference voltage $V_{REF}$ on the bit line BL in a pre-charge operation phase before the MTJ 206 in the coupled MRAM bit cells 204(0)(0)-204(M)(N) switches its memory state in response to a write operation, and a write operation voltage $V_{WRITE}$ on the bit line BL in a write operation phase to detect when the MTJ 206 in the coupled MRAM bit cells 204(0)(0)-204(M)(N) switches its memory state.

Figure 4B:
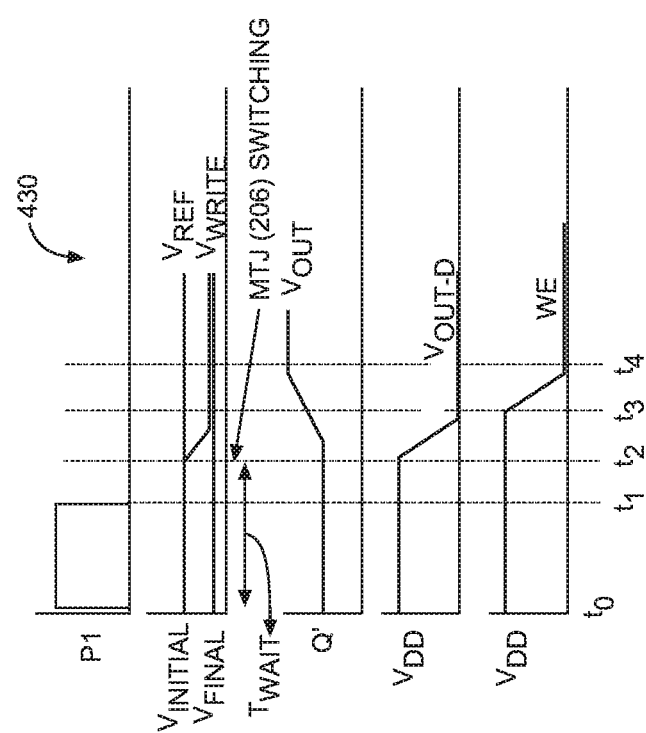
FIG. 4B is a timing diagram illustrating an exemplary timing of signals in the write operation sensing circuit in FIG. 4A.

In this regard, the voltage sensing circuit 414 includes a first control circuit 416(1) and a second control circuit 416(2), which are NMOS transistors in this example. A drain node D of the first control circuit 416(1) is coupled to the bit line BL, and a source node S of the first control circuit 416(1) is coupled to a first voltage input A. Thus, the first control circuit 416(1) is coupled to and between the first voltage input A of the differential sense amplifier 412, and the bit line BL is coupled to the MRAM bit cell 204. The first control circuit 416(1) is configured to couple the bit line BL to a charge storage circuit 418 (e.g., a capacitor) to pre-charge the charge storage circuit 418 to a reference voltage $V_{REF}$ as the bit line voltage $V_{BL}$ on the bit line BL, as opposed to using a fixed reference voltage for example. This accounts for process and environmental variations in the MRAM bit cell 204. The first control circuit 416(1) couples the bit line BL to the charge storage circuit 418 to pre-charge the charge storage circuit 418 to the bit line voltage $V_{BL}$ in response to a write operation signal P1 indicating a pre-charge operation phase (e.g., when logic '1'), as shown between time $t_0$ and time $t_1$ in a timing diagram 430 in FIG. 4B. In this example, the write operation signal P1 is coupled to the gate G of the first control circuit 416(1), and is an active high signal since the first control circuit 416(1) in this example is an NMOS transistor. The voltage sensing circuit 414 also includes the second control circuit 416(2), which is also an NMOS transistor in this example. A drain node D of the second control circuit 416(2) is coupled to the bit line BL, and a source node S of the second control circuit 416(2) is coupled to a second voltage input B. Thus, the second control circuit 416(2) is coupled to and between the second voltage input B of the differential sense amplifier 412, and the bit line BL is coupled to the MRAM bit cell 204. The second control circuit 416(2) is configured to couple the bit line BL to the second voltage input B of the differential sense amplifier 412 to couple a write operation voltage $V_{WRITE}$ as the bit line voltage $V_{BL}$ on the bit line BL based on a supply voltage $V_{DD}$ applied to the bit line BL in response to a write operation signal P1 indicating a write operation phase (e.g., a high signal level). In this example, a complement write operation signal/P1 is coupled to the gate G of the second control circuit 416(2), and is an active high signal when the write operation signal P1 is at a low signal level indicating a write operation phase as shown after time $t_1$ in the timing diagram 430 in FIG. 4B.

The write operation sensing circuit 410 is configured to couple a reference voltage $V_{REF}$ and write operation voltage $V_{WRITE}$ from the bit line BL. As discussed above, for a logic '0' write operation, the supply voltage $V_{DD}$ is applied to the supply voltage rail 409(1) to apply a positive voltage to the bit line BL. However, for a logic '1' write operation, the supply voltage $V_{DD}$ is applied to the ground voltage rail 409(2) to apply a positive voltage to the source line SL. The reason for this is because, as discussed above, the change in MTJ 206 resistance $R_{MTJ}$ after switching the magnetic orientation of the MTJ 206 is larger at a voltage rail that has the supply voltage $V_{DD}$ among the bit line voltage rail 408B and the source line voltage rail 408S than another voltage rail among the bit line voltage rail 408B and the source line voltage rail 408S having a negative voltage.

With continuing reference to FIG. 4A, the differential sense amplifier 412 has a first voltage input A configured to be coupled to the sensed reference voltage $V_{REF}$ by the voltage sensing circuit 414. The differential sense amplifier 412 has a second voltage input B configured to be coupled to a write operation voltage $V_{WRITE}$. After the pre-charge operation phase of the write operation, the voltage sensing circuit 414 is configured to couple the bit line voltage $V_{BL}$ at the bit line BL applied to the MRAM bit cell 204 as the write operation voltage $V_{WRITE}$ to the second voltage input B of the differential sense amplifier 412 in a write operation phase, as shown in the timing diagram 430 in FIG. 4B at time $t_2$. The differential sense amplifier 412 also has a voltage output Q. The differential sense amplifier 412 is configured to generate an output voltage $V_{OUT}$ on a voltage output Q' based on a difference between the reference voltage $V_{REF}$ and the write operation voltage $V_{WRITE}$, as shown in the timing diagram 430 in FIG. 4B. Thus, the differential sense amplifier 412 can compare the difference between the bit line voltage $V_{BL}$ as the reference voltage $V_{REF}$ before the magnetic orientation of the MTJ 206 is switched, to the bit line voltage $V_{BL}$ as the write operation voltage $V_{WRITE}$ after the magnetic orientation of the MTJ 206 is switched to detect when the MTJ 206 has switched. As discussed above, a resistance $R_{MTJ}$ of the MTJ 206 will change after its magnetic orientation is switched, which can be detected as a change in the write operation voltage $V_{WRITE}$ for the write operation.

In this regard, with continuing reference to FIG. 4A, the first and second voltage inputs A and B of the differential sense amplifier 412 are shown as being coupled to gates G of input transistors 420(1), 420(2) in the form of NMOS transistors. A write enable transistor 422 is controlled by a write enable signal WE to couple drain nodes D of the input transistors 420(1), 420(2) to ground node GND when the differential sense amplifier 412 is enabled. The differential sense amplifier 412 includes pull-up transistors 424(1), 424(2) in the form of PMOS transistors. The pull-up transistor 424(1) is gate diode connected. Thus, in response to the reference voltage $V_{REF}$ and the write operation voltage $V_{WRITE}$ present on the first and second voltage inputs A and B, the signal level of the reference voltage $V_{REF}$ and the write operation voltage $V_{WRITE}$ on the gates G of input transistors 420(1), 420(2) affect their drive strength and resistance. As shown in the timing diagram 430 in FIG. 4B, initially, the voltage input A receives an initial voltage $V_{INITIAL}$ and the reference voltage $V_{REF}$ from the voltage sensing circuit 414 in the pre-charge operation phase based on the write operation signal P1 being active between time $t_0$ and $t_1$. In the write operation phase when the write operation signal P1 is not active and the complement write operation signal/P1 is active, the voltage input A and the voltage input B receives the reference voltage $V_{REF}$. Both input transistors 420(1), 420(2) are activated with the pull-up transistors 424(1), 424(2) active to provide an output voltage $V_{OUT}$ to an output node Q' divided between the pull-up transistor 424(2) and the input transistor 420(2). However, after the wait time $T_{WAIT}$ when the MTJ 206 switches memory state causing the voltage on voltage input B to lower to the write operation voltage $V_{WRITE}$ as a final voltage $V_{FINAL}$, as shown between time $t_2$ and $t_3$ in the timing diagram 430 in FIG. 4B, the input transistor 420(2) is turned off causing the output voltage $V_{OUT}$ at output node Q' to increase to the supply voltage $V_{DD}$ minus the voltage drop across the pull-up transistor 424(2), as shown at time $t_4$ in the timing diagram 430 in FIG. 4B. An inverter circuit 426 is included in the differential sense amplifier 412 to be activated to drive an inverted output voltage $V_{OUT-D}$ on the output node Q as the write operation voltage $V_{WRITE}$ as shown at time $t_4$ in the timing diagram 430 in FIG. 4B to indicate that the write operation to the MTJ 206 has completed. The inverted output voltage $V_{OUT-D}$ can be provided to a write termination circuit 428 to generate the write enable signal WE enabling and disabling the differential sense amplifier 412. When the write operation is completed, the write termination circuit 428 can be configured to generate the write enable signal WE in a write disable state to disable to the differential sense amplifier 412 to conserve power.

Process variations can cause the threshold voltages of the input transistors 420(1), 420(2) to vary thus creating an offset voltage in the differential sense amplifier 412. This can cause the differential sense amplifier 412 to incorrectly compare the voltages as input nodes A and B which can cause the inverted output voltage $V_{OUT-D}$ to be shifted to a low voltage level to indicate a write operation has completed before the MTJ 206 has switched memory states. This can cause the write termination circuit 428 to incorrectly terminate the write operation before the MTJ 206 has switched memory states. Since the MTJ 206 write time can vary stochastically, the differential sense amplifier 412 needs to keep the inverted output voltage $V_{OUT-D}$ on the output node Q as a high voltage level until the MTJ 206 has switched memory state even with the process variation in the input transistors 420(1), 420(2). The size of the input transistors 420(1), 420(2) in the differential sense amplifier 412 can be increased to increase their drive strength to thus improve sensing margin, to mitigate process variation. However, size of the input transistors 420(1), 420(2) increases write energy in an undesired manner, when the intent of the write operation sensing circuit 410 is to be able to conserve write energy by terminating the write operation when completed.

Figure 5A:
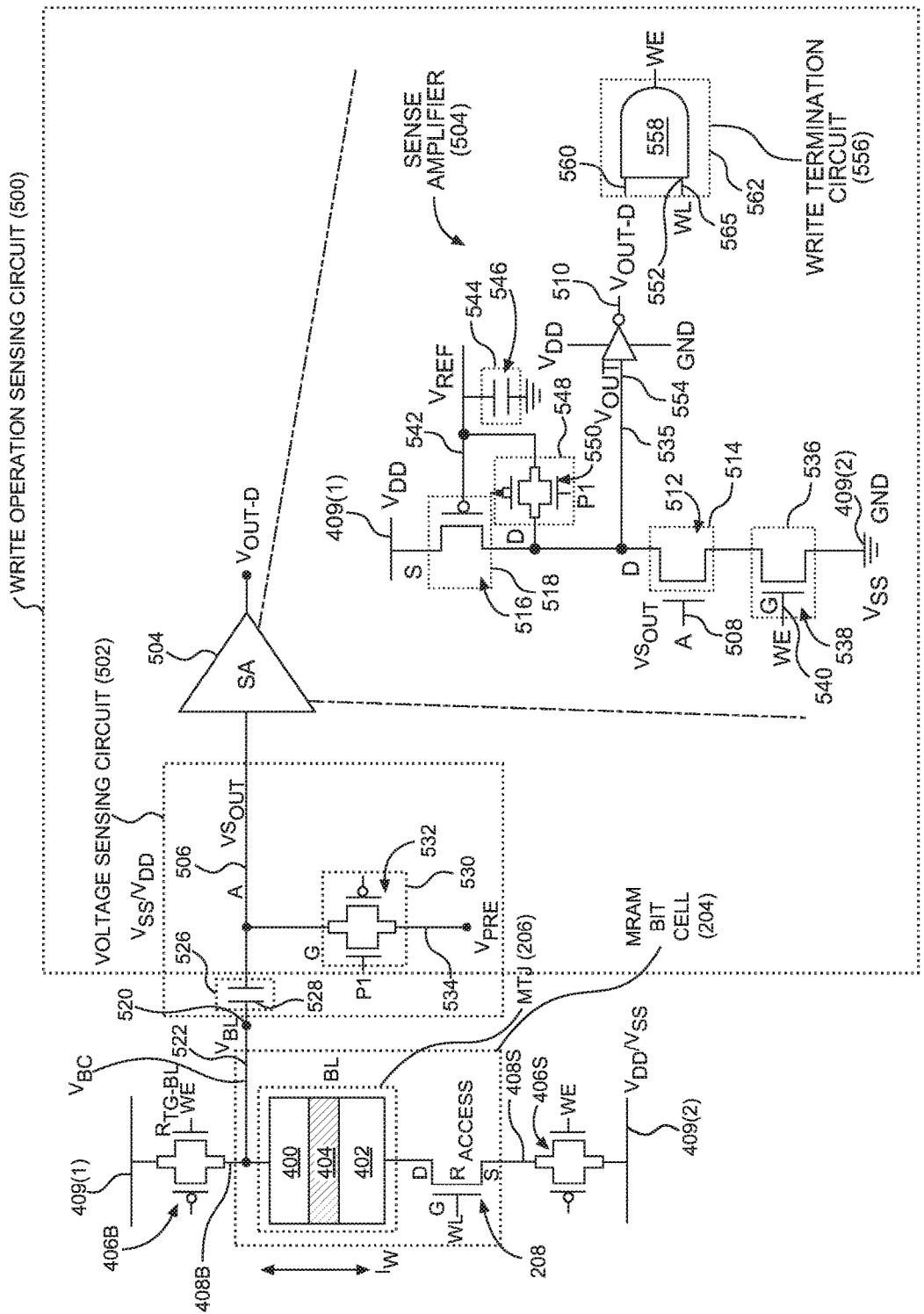
FIG. 5A is a schematic diagram of an exemplary MRAM bit cell in the MRAM array in FIG. 2 coupled to an offset-canceling (OC) write operation sensing circuit that includes a voltage sensing circuit with a capacitive-coupling effect configured to sense a voltage on a sense line in the MRAM bit cell for sensing both a logic '0' and '1' write operation, and a sense amplifier with an OC effect configured to generate an output voltage indicating the switching of an MTJ in the MRAM bit cell based on the sensed voltage by the voltage sensing circuit.

To avoid offset voltage issues from process variations in a differential sense amplifier, such as the differential sense amplifier 412 in FIG. 4A, a single input, single output, OC write operation sensing circuit 500 ("write operation sensing circuit 500") is provided to detect completion of a write operation to the MRAM bit cell 204, as shown in FIG. 5A. The MRAM bit cell 204 in FIG. 5A is the same MRAM bit cell 204 as shown in FIG. 4A, and thus will not be re-described. As will be described in more detail below, the write operation sensing circuit 500 is configured to sense when MTJ 206 switching occurs in the MRAM bit cell 204. The write operation sensing circuit 500 includes a voltage sensing circuit 502 and a sense amplifier 504. The voltage sensing circuit 502 employs a capacitive-coupling effect so that a sense output voltage $VS_{OUT}$ on a voltage sensing output 506 drops in response to MTJ 206 switching for both logic '0' and logic '1' write operations. The sense amplifier 504 has a single sense amplifier input 508 and a single sense amplifier output 510. The sense amplifier 504 is configured to generate an output voltage $V_{OUT}$ whose voltage level indicates if the switching of the memory state of the MTJ 206 has occurred in the MRAM bit cell 204. In this example, an input transistor 512 of an input control circuit 514 and a pull-up transistor 516 of a pull-up control circuit 518 in the sense amplifier 504 are kept above their sub-threshold regions. Thus, the input control circuit 514 and the pull-up transistor 516 remain operational to drive the output voltage $V_{OUT}$ to a voltage level indicating if the switching of the memory state of the MTJ 206 has occurred in the MRAM bit cell 204 to provide for a single sense amplifier 504. Otherwise, the voltage level of the output voltage $V_{OUT}$ would be driven to a high logic state regardless of the switching of the MTJ 206 in the MRAM bit cell 204 when the input transistor 512 is not operating outside its sub-threshold region in this example.

Further, as discussed in more detail below, by providing the single input transistor 512 and the single pull-up transistor 516 in the sense amplifier 504 in FIG. 5A to perform a voltage comparison to generate the output voltage $V_{OUT}$, an offset-canceling effect is created in the sense amplifier 504. This is because another input transistor is not provided in the sense amplifier 504 in a differential configuration like in the differential sense amplifier 412 in FIG. 4A for example. Similarly, another pull-up transistor is not provided in the sense amplifier 504 in a differential configuration like in the differential sense amplifier 412 in FIG. 4A. Thus, there are no offset voltages for the input transistor 512 and the pull-up transistor 516 in the sense amplifier 504 in FIG. 5A that would otherwise be present in the output voltage $V_{OUT}$ if not otherwise canceled.

In this regard, with reference to FIG. 5A, the voltage sensing circuit 502 includes a voltage sensing input 520 coupled to a sense line 522 of an MRAM bit cell 204. In this example, the sense line 522 is the bit line BL of the MRAM bit cell 204. The voltage sensing input 520 is configured to receive a bit cell voltage $V_{BC}$ on the sense line 522, which is the bit line voltage $V_{BL}$ in this example. The voltage sensing circuit 502 also includes the voltage sensing output 506 coupled to the sense amplifier input 508 of the sense amplifier 504. The voltage sensing circuit 502 also includes a charge storage circuit 526 in the form of a capacitor circuit 528 in this example coupled to the voltage sensing input 520 and the voltage sensing output 506. The voltage sensing circuit 502 also includes a pre-charge control circuit 530 in the form of a pass-gate in this example coupled to the voltage sensing output 506. The pre-charge control circuit 530 is configured to receive a pre-charge voltage $V_{PRE}$. The pre-charge control circuit 530 is configured to couple a pre-charge voltage input 534 to the voltage sensing output 506 when activated by a write operation signal P1 being a pre-charge operation phase (i.e., active high), as shown at time $t_0$ in a timing diagram 564 in FIG. 5B, to charge the voltage sensing output 506 to the pre-charge voltage $V_{PRE}$. This is also shown in the pre-charge operational phase diagram of the write operation sensing circuit 500 in FIG. 6A. The pre-charge control circuit 530 is deactivated by the write operation signal P1 being in a write operation phase (i.e., inactive low), as shown at time $t_1$ in the timing diagram 564 in FIG. 5B. This is also shown in the write operation phase diagram of the write operation sensing circuit 500 in FIG. 6B. In this example, the pre-charge voltage $V_{PRE}$ applied to the gate G of the input transistor 512 is at a voltage at or above the threshold voltage of the input transistor 512 so that the input transistor 512 operates in its operating region (i.e., linear or saturation operating region) in the pre-charge operation phase. When the pre-charge control circuit 530 is deactivated by the write operation signal P1 being in a write operation phase, the charge storage circuit 526 is capacitively coupled to the voltage sensing output 506 to decrease the pre-charge voltage $V_{PRE}$ on the voltage sensing output 506.

With continuing reference to FIG. 5A, the sense amplifier 504 in the write operation sensing circuit 500 includes the pre-charge voltage input 534 configured to receive the sense output voltage $VS_{OUT}$ on the voltage sensing output 506 of the voltage sensing circuit 502. The sense amplifier 504 also includes a first sense amplifier output 535 configured to be charged to a first sense amplifier output voltage $V_{OUT}$ indicative of whether the voltage sensing output 506 from the sense output voltage $VS_{OUT}$ indicates the MTJ 206 in the MRAM bit cell 204 has switched memory states. The sense amplifier 504 includes the input control circuit 514 in the form of the input transistor 512, which is an NMOS transistor in this example. A drain D of the input transistor 512 is coupled to the first sense amplifier output voltage $V_{OUT}$. A source S of the input transistor 512 is coupled to a write enable control circuit 536 in the form of an NMOS transistor 538 whose gate G is coupled to a write enable signal WE on a write enable line 540. Thus, the sense output voltage $VS_{OUT}$ from the voltage sensing circuit 502 coupled to the gate G of the input transistor 512 controls drive strength of the input transistor 512.

With continuing reference to FIG. 5A, the sense amplifier 504 also includes the pull-up control circuit 518 in the form of a pull-up transistor 516. A gate G of the pull-up transistor 516 is coupled to a reference voltage input 542 configured to receive a sense amplifier reference voltage $V_{REF}$. A source S of the pull-up transistor 516 is coupled to the supply voltage rail 409(1) configured to receive the supply voltage $V_{DD}$. A drain D of the pull-up transistor 516 is coupled to the first sense amplifier output 535. A second charge storage circuit 544 in the form of a capacitor circuit 546 in this example is coupled to the reference voltage input 542. A second pre-charge control circuit 548 in the form of a pass gate 550 in this example is coupled to the gate G of the pull-up control circuit 518 and the reference voltage input 542. The second pre-charge control circuit 548 is configured to couple the reference voltage input 542 to the first sense amplifier output 535 to gate diode connect the pull-up transistor 516 when activated by a write operation signal P1 being in a pre-charge operation phase (i.e., active high), as shown at time $t_0$ in the timing diagram 564 in FIG. 5B, to charge the reference voltage input 542 to the reference voltage $V_{REF}$. This is also shown in the pre-charge operational phase diagram of the write operation sensing circuit 500 in FIG. 6A. The reference voltage $V_{REF}$ applied to the gate G of the pull-up transistor 516 keeps the pull-up transistor 516 in its threshold operating region. The second pre-charge control circuit 548 is deactivated by the write operation signal P1 being in a write operation phase (i.e., inactive low), as shown at time $t_1$ in the timing diagram 564 in FIG. 5B. This is also shown in the write operational phase diagram of the write operation sensing circuit 500 in FIG. 6B. When the second pre-charge control circuit 548 is deactivated by the write operation signal P1 being in a write operation phase, the supply voltage $V_{DD}$ is divided between the pull-up transistor 516 and the input transistor 512 to control the first sense amplifier output voltage $V_{OUT}$. Thus, the relative voltage level of the voltage sense output voltage $VS_{OUT}$ in the write operation phase applied the gate G of the input transistor 512 and the reference voltage $V_{REF}$ applied to the gate G of the pull-up transistor 516 controls the first sense amplifier output voltage $V_{OUT}$.

As discussed in more detail below, when the pre-charge control circuit 530 is activated by a write operation signal P1 in a pre-charge operation phase (i.e., active high) in response to a word line signal WL being active, as shown at time $t_0$ in the timing diagram 564 in FIG. 5B, to pre-charge the voltage sensing output 506 to the pre-charge voltage $V_{PRE}$, the charge storage circuit 526 is configured to store a differential voltage between the pre-charge voltage $V_{PRE}$ and the bit cell voltage $V_{BL}$ (e.g., bit line voltage $V_{BL}$) on the sense line 522. Also as discussed in more detail below, when the pre-charge control circuit 530 in the voltage sensing circuit 502 is deactivated by the write operation signal P1 being in a write operation phase (i.e., inactive low), as shown at time $t_1$ in the timing diagram 564 in FIG. 5B, the charge storage circuit 526 is capacitively coupled to the voltage sensing output 506 to decrease the pre-charge voltage $V_{PRE}$ on the voltage sensing output 506. In either case of the pre-charge control circuit 530 being activated or deactivated, the sense output voltage $VS_{OUT}$ is generated at a voltage level that will keep the input transistor 512 from operating in its sub-threshold region so that the output voltage $V_{OUT}$ indicates if the switching of the memory state of the MTJ 206 has occurred in the MRAM bit cell 204. This is opposed to the voltage sensing input 520 being directly coupled to the input transistor 512, which can cause the input transistor 512 to be deactivated when a write operation is a logic '1' write operation. This would cause the output voltage $V_{OUT}$ to be driven to a high logic state regardless of the switching of the MTJ 206 in the MRAM bit cell 204.

Figure 7A:
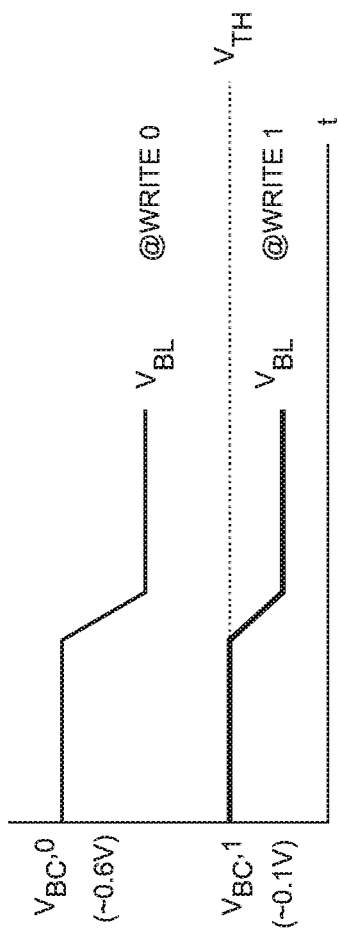
FIG. 7A illustrates the operation of the pre-charge control circuit in the voltage sensing circuit in the OC write operation sensing circuit in FIG. 5A configured to charge an output node to a pre-charge voltage and to charge a charge storage circuit in a pre-charge operation phase, to provide a capacitive-coupling effect in a write operation phase to reduce the difference in voltage drop on the output node in the pre-charge voltage output for both a logic '0' and '1' write operation to keep the input transistor in the sense amplifier out of its sub-threshold region.
Figure 7B:
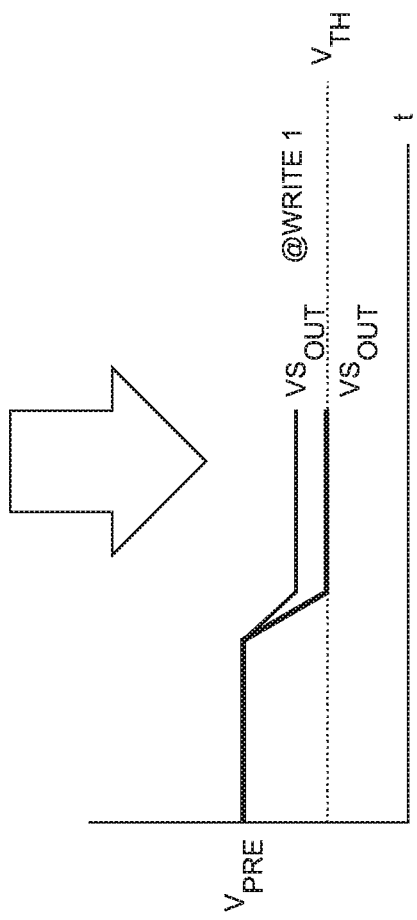
FIG. 7B is a diagram illustrating exemplary voltages on the voltage sensing input and output of the voltage sensing circuit in FIG. 6A in the pre-charge operation phase and the write operation phase in response to an MTJ switching in the MRAM bit cell.

For example, as shown in FIG. 7A, for a logic '0' write operation, the bit cell voltage $V_{BC}$ of the MRAM bit cell 204 may be at a voltage level above the threshold voltage of the input transistor 512 such that the sense amplifier 504 can operate. However, as also shown in FIG. 7A, for a logic '1' write operation, the bit cell voltage $V_{BC}$ of the MRAM bit cell 204 may be at a voltage level below the threshold voltage of the input transistor 512 such that the input transistor 512 is inactive and the sense amplifier 504 cannot operate to sense the sense output voltage $VS_{OUT}$. However, as shown in FIG. 7B, by the pre-charge control circuit 530 pre-charging the voltage sensing output 506 to the pre-charge voltage $V_{PRE}$, the pre-charge voltage $V_{PRE}$ is provided to keep the input transistor 512 of the sense amplifier 504 in its operating region outside its sub-threshold region so that the input transistor 512 of the sense amplifier 504 is operational for the sense amplifier 504 to be able to detect a logic '0' or logic '1' write operation. This allows the sense amplifier 504 to have a single input, which reduces the area of the sense amplifier 504 and avoids an offset voltage caused by a differential input transistor arrangement like in the differential sense amplifier 412 in FIG. 4A. This also allows the voltage sensing circuit 502 to be able to sense completion of both a logic '0' or logic '1' write operation with only being coupled to the bit line BL of the MRAM bit cell 204. Otherwise, the voltage sensing circuit 502 would have to be a more complex circuit with larger area that is configured to be coupled to the bit line BL and the source line SL to keep the input transistor 512 active to allow the sense amplifier 504 to detect a logic '0' or logic '1' write operation.

Figure 5B:
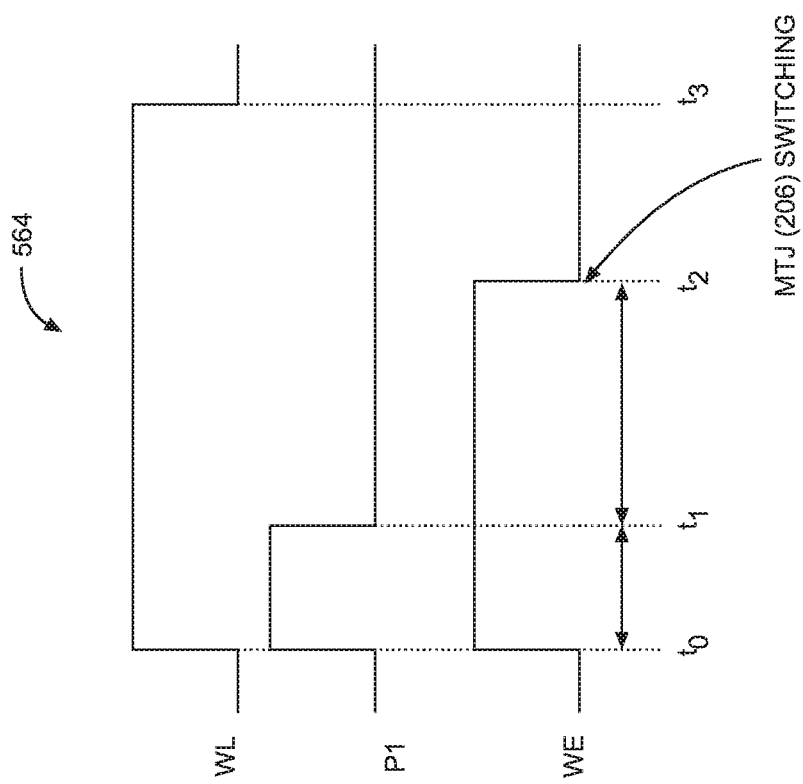
FIG. 5B is a timing diagram illustrating an exemplary timing of signals in the OC write operation sensing circuit in FIG. 5A.

Then, in response to the write operation signal P1 indicating a write operation phase (i.e., inactive low) as shown at time $t_1$ in the timing diagram 564 in FIG. 5B, the pre-charge control circuit 530 in the voltage sensing circuit 502 is deactivated to decouple the pre-charge voltage input 534 from the voltage sensing output 506. This causes the charge storage circuit 526 to be capacitively coupled to the voltage sensing output 506 to maintain the pre-charge voltage $V_{PRE}$ on the voltage sensing output 506. Then, when a write operation occurs in the MRAM bit cell 204, as shown in FIG. 7A, the bit line voltage $V_{BL}$ is reduced with a logic '1' write operation reducing the bit line voltage $V_{BL}$ below a threshold voltage $V_{TH}$ of the input transistor 512 in the sense amplifier 504. However, as shown in FIG. 7A, by the charge storage circuit 526 being capacitively coupled to the voltage sensing output 506, both a logic '0' and logic '1' write operation reduce the sense output voltage $VS_{OUT}$ on the voltage sensing output 506, but still above the threshold voltage $V_{TH}$ of the input transistor 512 in the sense amplifier 504. Thus, the voltage sensing circuit 502 can be coupled to only the bit line BL of the MRAM bit cell 204 and still be able to generate a sense output voltage $VS_{OUT}$ that allows the input transistor 512 of the sense amplifier 504 as a single input to operate for both logic write operations without having to provide a differential input transistor arrangement.

Further, an offset-canceling effect is created in the sense amplifier 504 in FIG. 5A by use of the single input transistor 512 and the single pull-up transistor 516 to perform a voltage comparison to generate the output voltage $V_{OUT}$ indicating the switching state of the MTJ 206. There are no transistors provided in a differential configuration in the sense amplifier 504 to generate the output voltage $V_{OUT}$ indicating the switching state of the MTJ 206. Thus, there are no offset voltages present between differential transistors in the sense amplifier 504. With continuing reference to FIG. 5A the sense amplifier 504 in this example also includes an inverter circuit 552 comprising an inverter input 554 coupled to the first sense amplifier output 535 and coupled to the second sense amplifier output 510. The inverter circuit 552 configured to generate an inverted second sense amplifier output voltage $V_{OUT-D}$ based on the voltage level of the first sense amplifier output voltage $V_{OUT}$ once the first sense amplifier output voltage $V_{OUT}$ is of a voltage level sufficient to activate the inverter circuit 552. A write termination circuit 556 in the form of an AND gate 558 in this example is provided to terminate a write operation in response to detecting the switching of the MTJ 206 in the MRAM bit cell 204. The write termination circuit 556 comprises a first input 560 coupled to the second sense amplifier output 510 and a second input 562 coupled to a word line 565 carrying a word line signal WL indicating a write operation state. The write termination circuit 556 is configured to generate the write enable signal WE based on the second sense amplifier output voltage $V_{OUT-D}$ and the word line signal WL. If the second sense amplifier output voltage $V_{OUT-D}$ and the word line signal WL are active high signals, the write enable signal WE is generated in a write enable state (i.e., active high) to activate the write enable control circuit 536 to enable operation of the sense amplifier 504. If either the second sense amplifier output voltage $V_{OUT-D}$ or the word line signal WL are active low signals, the write enable signal WE is generated in a write disable state (i.e., inactive low) to deactivate the write enable control circuit 536 to disable operation of the sense amplifier 504, which will terminate a write operation in response to a detected switch of a memory state in the MTJ 206 of the MRAM bit cell 204.

Figure 6A:
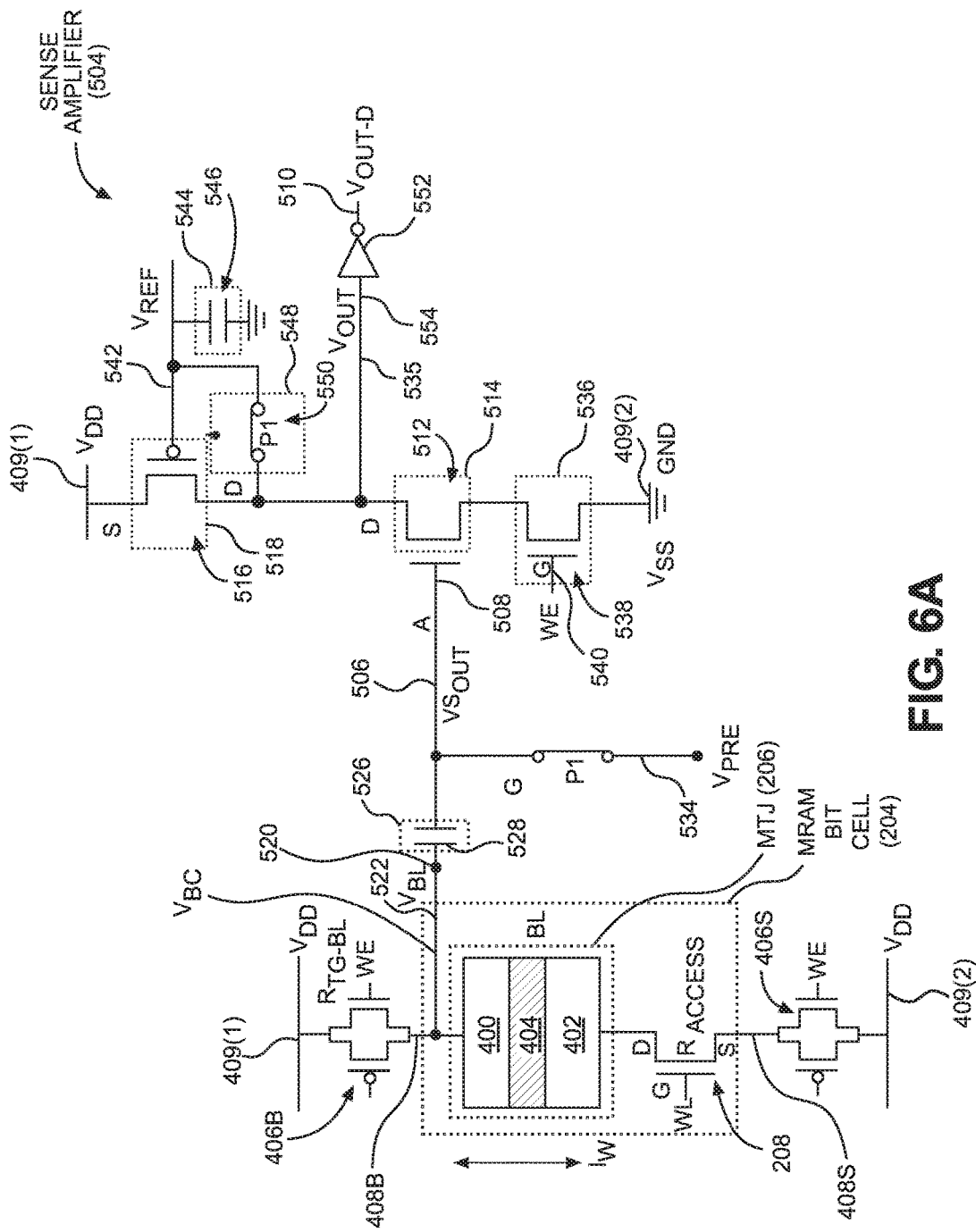
FIG. 6A illustrates the operation of the OC write operation sensing circuit in a pre-charge operation phase in response to a write operation.
Figure 8A:
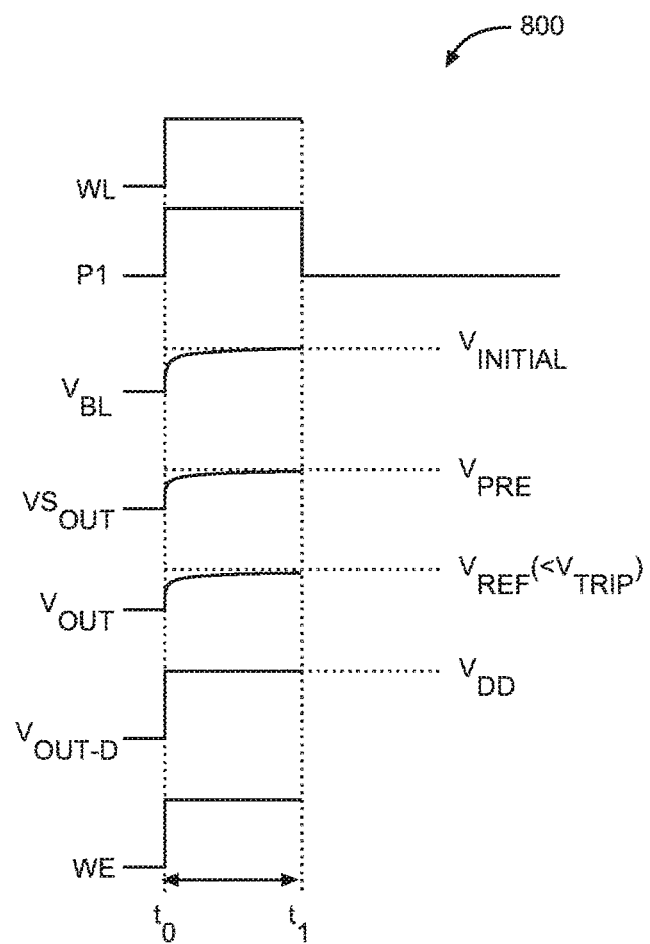
FIG. 8A is a timing diagram illustrating an exemplary timing of signals in the OC write operation sensing circuit in FIG. 6A for the pre-charge operation phase.

FIG. 8A is a timing diagram 800 illustrating an exemplary timing of signals in the write operation sensing circuit 500 in FIG. 5A in the pre-charge operation phase. The timing diagram 800 in FIG. 8A will be discussed in conjunction with the write operation sensing circuit 500 in FIG. 5A to explain the pre-charge operation phase as shown in FIG. 6A. As shown in FIG. 8A, in response to a write operation to the MRAM bit cell 204, the word line signal WL goes active high at time $t_0$. This cause the access transistor 208 in the MRAM bit cell 204 in FIG. 5A to be active. In response, the bit line voltage $V_{BL}$ rises to an initial voltage $V_{INITIAL}$ as shown in FIG. 8A. The write operation signal P1 is also activated for a pre-charge operation phase at time $t_0$ as shown in FIG. 8A to go active high to activate the pre-charge control circuit 530 in the voltage sensing circuit 502 in the write operation sensing circuit 500 in FIG. 5A. This couples the pre-charge voltage input 534 to be coupled to the voltage sensing output 506 to charge the sense output voltage $VS_{OUT}$ on the voltage sensing output 506 to the pre-charge voltage $V_{PRE}$. The pre-charge voltage $V_{PRE}$ is coupled to the gate G of the input transistor 512 in the sense amplifier 504. The second pre-charge control circuit 548 in the sense amplifier 504 is also activated in response to the write operation signal P1 being active at time $t_0$ as shown in FIG. 8A, to pre-charge the first sense amplifier output voltage $V_{OUT}$ on the first sense amplifier output 535 to the reference voltage $V_{REF}$. As shown in FIG. 8A, the reference voltage $V_{REF}$ is not a high enough voltage level to exceed the threshold voltage of the inverter circuit 552, and thus the inverter circuit 552 asserts the supply voltage $V_{DD}$ on the second sense amplifier output voltage $V_{OUT-D}$. Because the second sense amplifier output voltage $V_{OUT-D}$ is the supply voltage $V_{DD}$ in the pre-charge operation phase and the word line signal WL is enabled, the write termination circuit 556 generates the write enable signal WE in a write enable state to activate the write enable control circuit 536 in the sense amplifier 504.

Figure 6B:
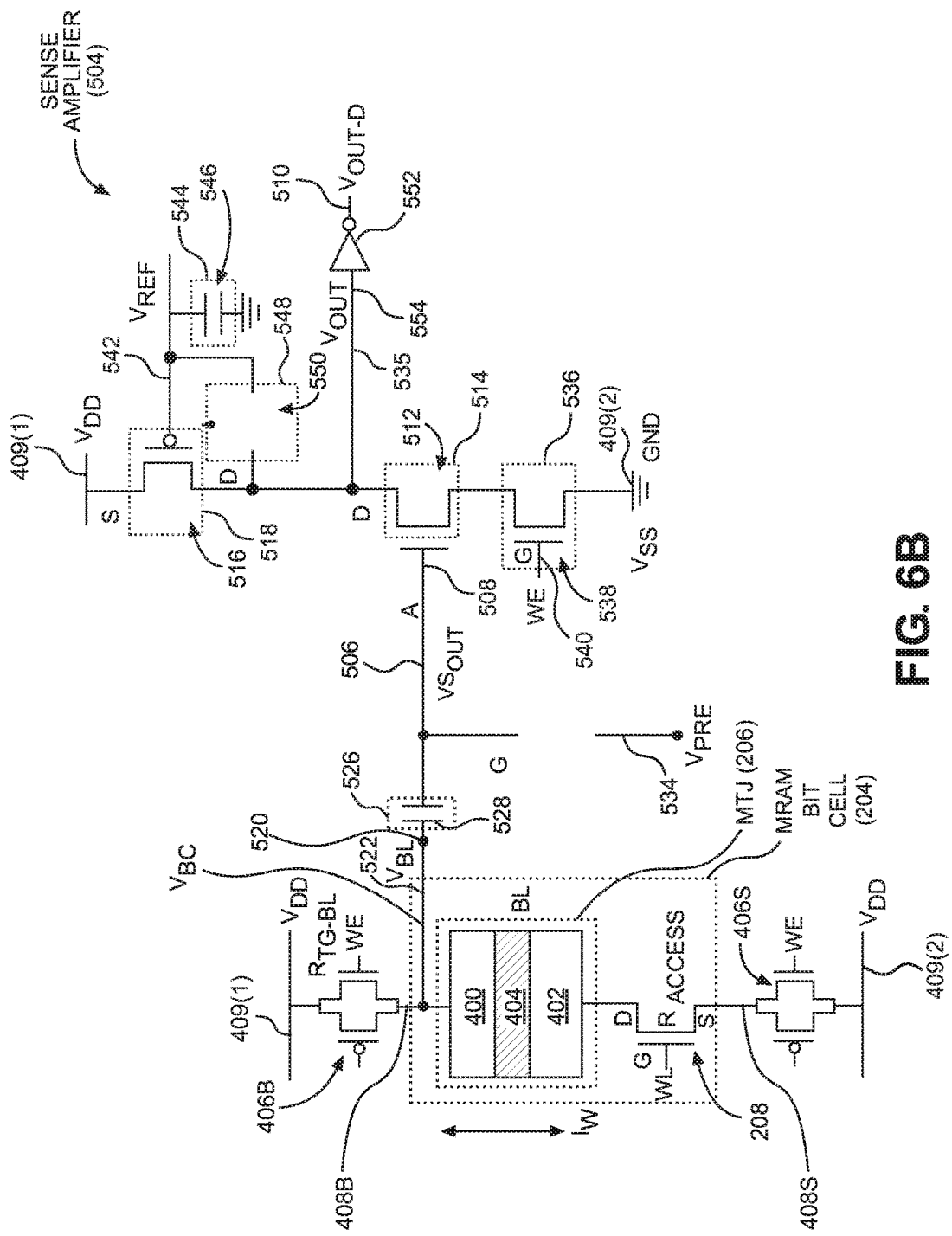
FIG. 6B illustrates the operation of the OC write operation sensing circuit in a write operation phase in response to a write operation.
Figure 8B:
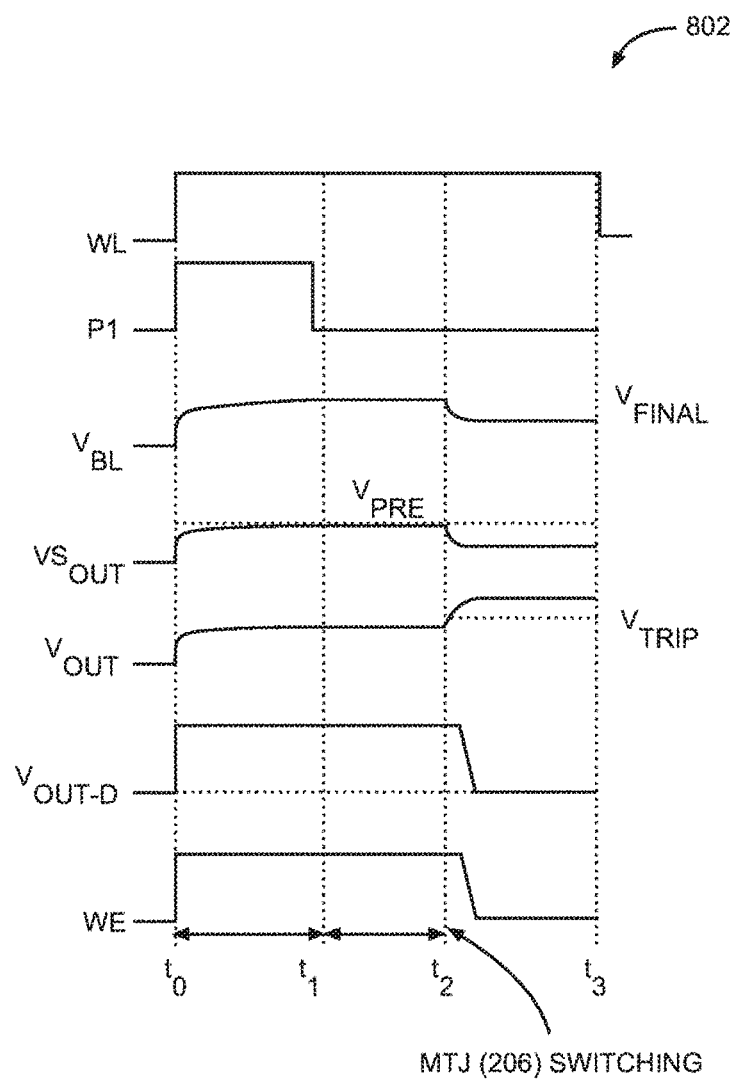
FIG. 8B is a timing diagram illustrating an exemplary timing of signals in the OC write operation sensing circuit in FIG. 6B for the write operation phase.

FIG. 8B is a timing diagram 802 illustrating an exemplary timing of signals in the write operation sensing circuit 500 in FIG. 5A in the write operation phase. The timing diagram 802 in FIG. 8B will be discussed in conjunction with the write operation sensing circuit 500 in FIG. 5A as it is in the pre-charge operation phase as shown in FIG. 6B. In this regard, as shown in FIG. 8B, at time $t_1$, the write operation signal P1 is deactivated. This disables the pre-charge control circuit 530 in the voltage sensing circuit 502 in the write operation sensing circuit 500 in FIG. 5A. This decouples the pre-charge voltage input 534 from the voltage sensing output 506. However, the capacitive coupling of the charge storage circuit 526 maintains the pre-charge voltage $V_{PRE}$ on the voltage sensing output 506. Thus, the gate G of the input transistor 512 of the sense amplifier 504 is maintained as the pre-charge voltage $V_{PRE}$. The first sense amplifier output voltage $V_{OUT}$. The second sense amplifier output voltage $V_{OUT-D}$, and the write enable signal WE are maintained in their pre-charge operation phase state by the sense amplifier 504. However, after the MTJ 206 switches in the MRAM bit cell 204 as shown at time $t_2$ in a timing diagram 802 in FIG. 8B, the bit line voltage $V_{BL}$ drops as previously discussed and shown in FIG. 7A. The sense output voltage $VS_{OUT}$ on the voltage sensing output 506 also drops as a result as shown in FIG. 8B, thus causing the drive strength of the input transistor 512 to weaken causing the first sense amplifier output voltage $V_{OUT}$ to rise to a trip voltage $V_{TRIP}$. The input transistor 512 and pull-up transistor 516 are sized such that the drop in the sense output voltage $VS_{OUT}$ causes the first sense amplifier output voltage $V_{OUT}$ to rise to the trip voltage $V_{TRIP}$ above the threshold voltage of the inverter circuit 552, thus driving the second sense amplifier output voltage $V_{OUT-D}$ to ground voltage at the ground node GND. In response, the write termination circuit 556 drives the write enable signal WE to a low voltage level in a write disable state, which in turn deactivates the write enable control circuit 536 to disable the sense amplifier 504.

Figure 9:
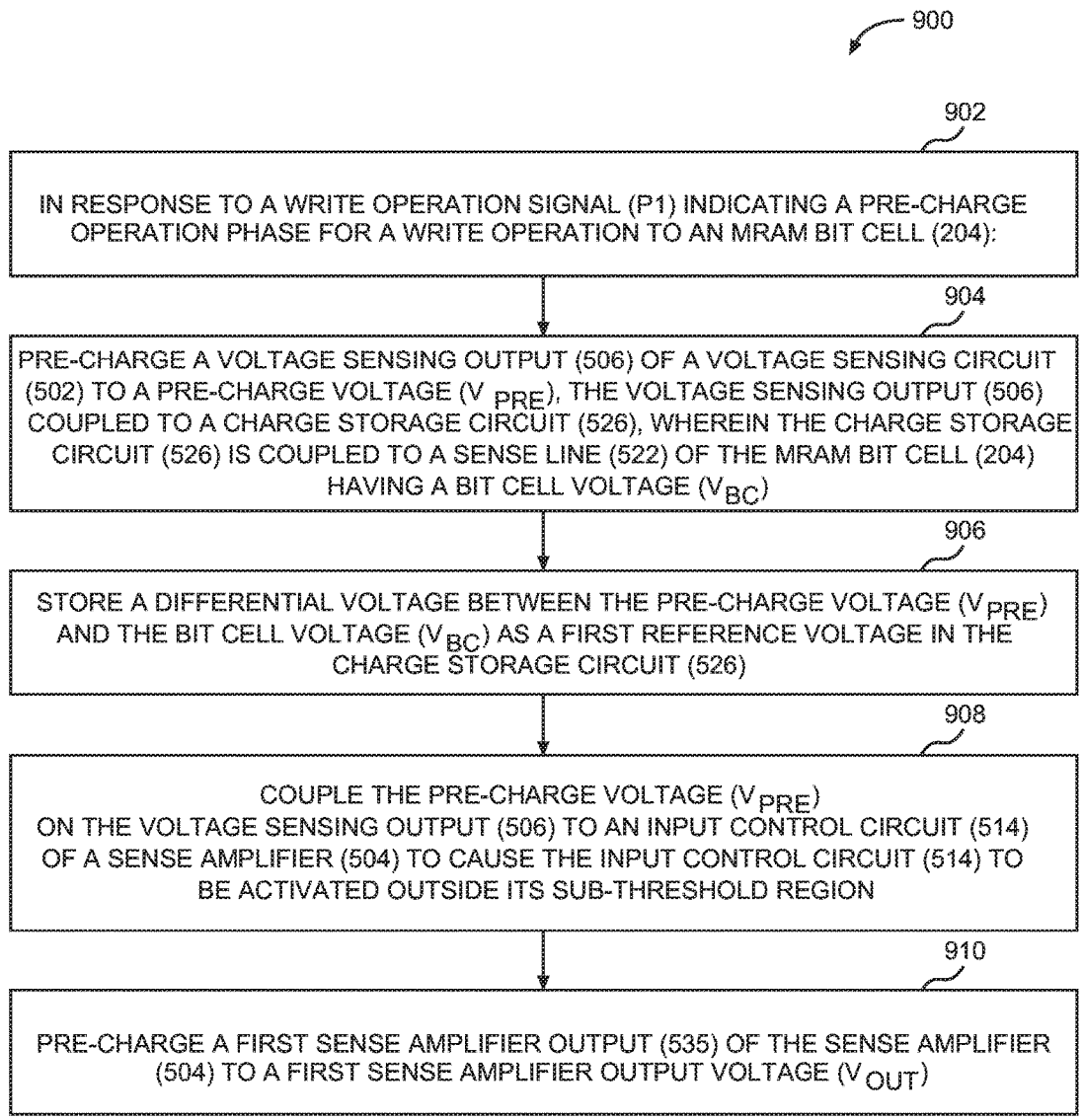
FIG. 9 is flowchart illustrating an exemplary process of the pre-charge operation phase for the OC write operation sensing circuit in FIG. 5A before detecting MTJ switching in an MRAM bit cell in a write operation phase in response to a write operation.

FIG. 9 is flowchart illustrating an exemplary process 900 of the pre-charge operation phase for the write operation sensing circuit 500 in FIG. 5A before detecting MTJ 206 switching in an MRAM bit cell 204 in a write operation phase in response to a write operation. In response to the write operation signal P1 indicating a pre-charge operation phase for a write operation to an MRAM bit cell 204 (block 902), the process 900 includes pre-charging a voltage sensing output 506 of a voltage sensing circuit 502 to a pre-charge voltage $V_{PRE}$, the voltage sensing output 506 coupled to a charge storage circuit 526, wherein the charge storage circuit 526 is coupled to a sense line 522 of an MRAM bit cell 204 having a bit cell voltage $V_{BC}$ (block 904). The process 900 also includes storing a differential voltage between the pre-charge voltage $V_{PRE}$ and the bit cell voltage $V_{BC}$ as a first reference voltage in the charge storage circuit 526 (block 906). The process 900 also includes coupling the pre-charge voltage $V_{PRE}$ on the voltage sensing output 506 to an input control circuit 514 of a sense amplifier 504 to cause the input control circuit 514 to be activated outside its sub-threshold region (block 908). The process 900 also includes pre-charging a first sense amplifier output 535 of the sense amplifier 504 to a first sense amplifier output voltage $V_{OUT}$ (block 910).

Figure 10:
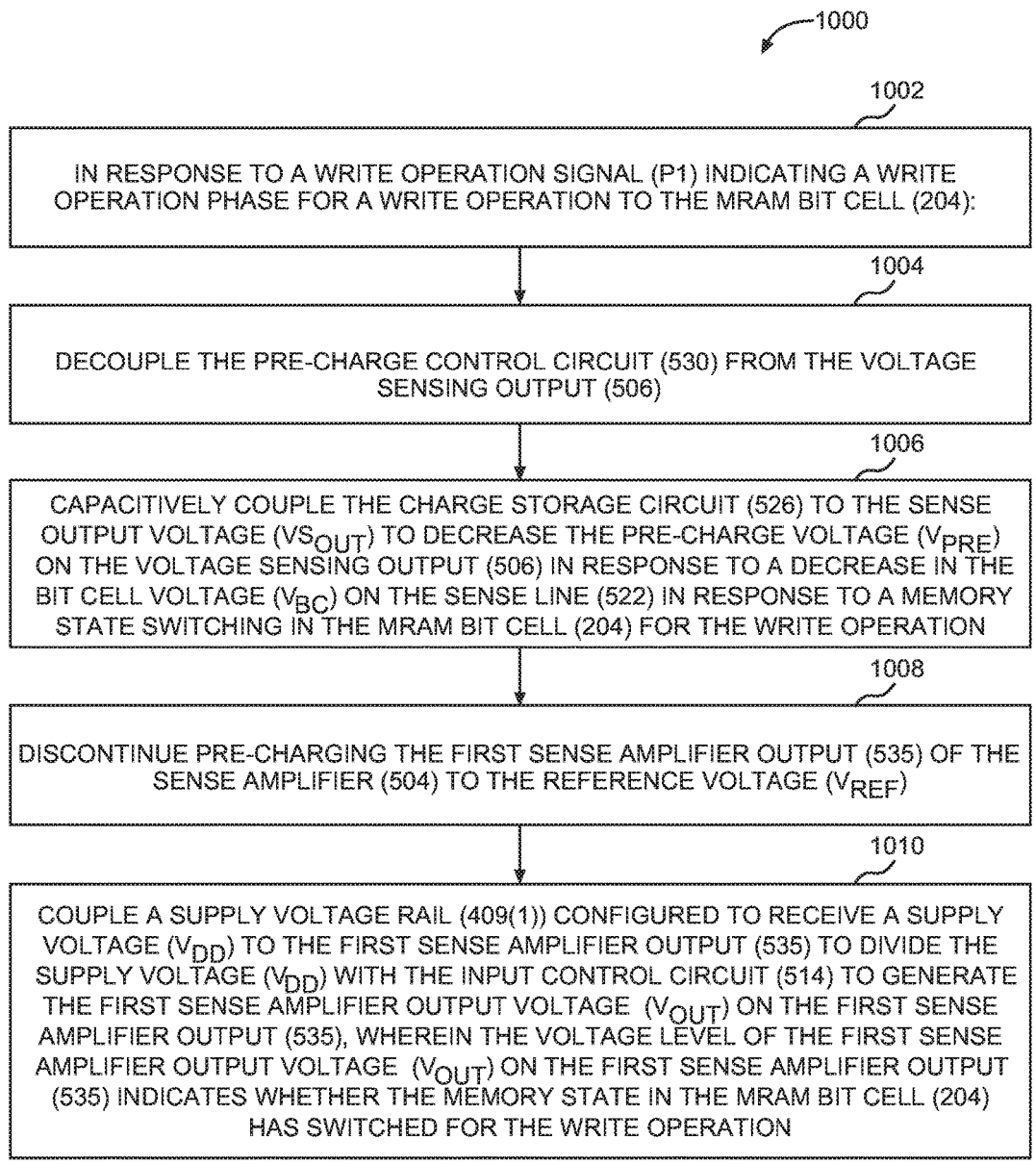
FIG. 10 is flowchart illustrating an exemplary process of the pre-charge operation phase for the OC write operation sensing circuit in FIG. 5A to detect MTJ switching in an MRAM bit cell in response to a write operation.

FIG. 10 is flowchart illustrating an exemplary process 1000 of the write operation phase for the write operation sensing circuit 500 in FIG. 5A to detect MTJ 206 switching in an MRAM bit cell 204 in response to a write operation. In this regard, in response to a write operation signal P1 indicating a write operation phase for a write operation to the MRAM bit cell 204 (block 1002), the process 1000 includes decoupling the pre-charge control circuit 530 from the voltage sensing output 506 (block 1004). The process 1000 also includes capacitively coupling the charge storage circuit 526 to the sense output voltage $VS_{OUT}$ to decrease the pre-charge voltage $V_{PRE}$ on the voltage sensing output 506 in response to a decrease in the bit cell voltage $V_{BC}$ on the sense line 522 in response to a memory state switching in the MRAM bit cell 204 for the write operation (block 1006). The process 1000 also includes discontinuing pre-charging the first sense amplifier output 535 of the sense amplifier 504 to the reference voltage $V_{REF}$ (block 1008). The process 1000 also includes coupling a supply voltage rail 409(1) configured to receive a supply voltage $V_{DD}$ to the first sense amplifier output 535 to divide the supply voltage $V_{DD}$ with the input control circuit 514 to generate the first sense amplifier output voltage $V_{OUT}$ on the first sense amplifier output 535, wherein the voltage level of the first sense amplifier output voltage $V_{OUT}$ on the first sense amplifier output 535 indicates whether the memory state in the MRAM bit cell 204 has switched for the write operation (block 1010).

FIG. 11A is a schematic diagram of an exemplary phase control circuit 1100 that can be provided for generating the write operation signal P1 and the complement write operation signal/P1 for the write operation sensing circuit 500 in FIG. 5A. As shown in FIG. 11A, the phase control circuit 1100 includes a phase control input 1102 configured to be coupled to a word line 1104 coupled to the MRAM bit cell 204 (see FIG. 5A). The phase control input 1102 is configured to receive a word line signal WL from the word line 1104 in response to a write operation to the MRAM bit cell 204. The phase control circuit 1100 also includes a first phase control output 1106 and a second phase control output 1108. The phase control circuit 1100 is configured to generate the write operation signal P1 indicating the pre-charge operation phase for a write operation on the first phase control output 1106 in response to the word line signal WL. The phase control circuit 1100 may include a delay circuit 1110, which may be in the form of a delay line 1112 formed by a series of inverter gates, that is configured to delay the word line signal WL to generate a delayed word line signal WL-D. The delayed word line signal WL-D may then be further inverted if needed by an inverter gate 1113 and gated by an AND-based gate 1114 with the word line signal WL. The delayed word line signal WL-D controls deactivation of the write operation signal P1 when the pre-charge operation phase is completed to indicate a write operation phase. The phase control circuit 1100 is also configured to generate a complement write operation signal/P1 indicating the write operation phase on the second phase control output 1108 in response to the delayed word line signal WL-D. The phase control circuit 1100 is configured to generate the complement write operation signal/P1 indicating the write operation phase when the write operation signal P1 is not active/high. The complement write operation signal/P1 is generated on the second phase control output 1108 as a result of delaying the delayed word line signal WL-D through an inverter gate 1116 and gating the signal through an AND-based gate 1118 with the word line signal WL. Thus, when the word line signal WL becomes inactive low, this will cause the complement write operation signal/P1 to also become inactive low.

FIG. 11B is a timing diagram 1120 illustrating exemplary timing of generation of the write operation signal P1 and the complement write operation signal/P1 generated by the phase control circuit 1100 in FIG. 11A for a logic '0' write operation performed in the MRAM bit cell 204 in FIG. 5A. As shown therein, the word line signal WL is pulled active high at time $t_0$. The write operation signal P1 is pulled active high in response to the delayed word line signal WL-D as an active low signal at time $t_0$. After a delay by the delay circuit 1110 in FIG. 11B at time $t_1$, the write operation signal P1 is pulled inactive low in response to the delayed word line signal WL-D, whereas the complement write operation signal/P1 is pulled active high in response to the delayed word line signal WL-D also at time $t_1$ The complement write operation signal/P1 is pulled inactive low in response to the word line signal WL being pulled inactive low at time $t_2$.

FIG. 11C is a timing diagram 1122 illustrating exemplary timing of generation of the write operation signal P1 and the complement write operation signal/P1 generated by the phase control circuit 1100 in FIG. 11A for a logic '1' write operation performed in the MRAM bit cell 204 in FIG. 5A. As shown therein, the word line signal WL is pulled active high at time $t_0$. The write operation signal P1 is pulled active high to indicate the pre-charge operation phase in response to the delayed word line signal WL-D as an active low (L) signal at time $t_0$. After a delay by the delay circuit 1110 in FIG. 11C at time $t_1$, the write operation signal P1 is pulled inactive low to indicate the write operation phase in response to the delayed word line signal WL-D, whereas the complement write operation signal/P1 is pulled active high in response to the delayed word line signal WL-D also at time $t_1$ The complement write operation signal/P1 is pulled inactive low in response to the word line signal WL being pulled inactive low at time $t_2$.

Figures 12A, 12B, 12C:
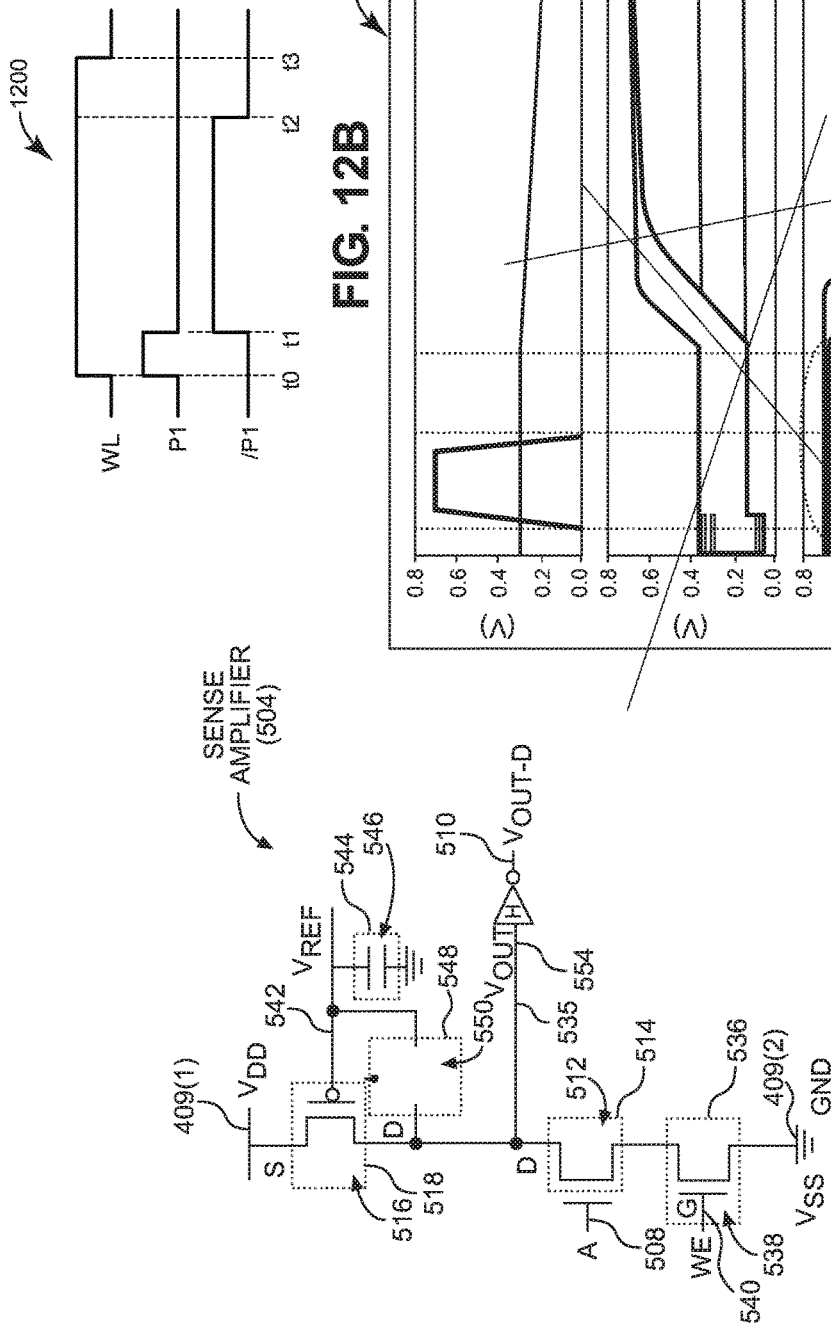
FIG. 12A is a diagram illustrating the sense amplifier in the OC write operation sensing circuit in FIG. 5A and illustrating design considerations for the sizing of the input transistor and the pull-up transistor.
FIG. 12B is a timing diagram illustrating exemplary timing of the operation phase signal to enable the pre-charge operation phase and the write operation phase of the OC write operation sensing circuit in FIG. 5A and to illustrate the design considerations for determining the pulse width of the operation phase signal to control the timing between the pre-charge operation and write operation phases.
FIG. 12C is a graph illustrating the timing of output voltages on the output node of the sense amplifier of the OC write operation sensing circuit in FIG. 12A as a function of transistor size and pulse width of the operation phase signal.

There are several exemplary design considerations to be made in the write operation sensing circuit 500 in FIG. 5A, which is also shown in FIG. 12A. As shown in a timing diagram 1200 in FIG. 12B, during the time period between $t_0$ and $t_1$ and the waiting phase between $t_1$ and $t_2$ in the pre-charge operation phase of the write operation sensing circuit 500, the sense amplifier 504 can be designed to keep the second sense amplifier output voltage $V_{OUT-D}$ to the supply voltage $V_{DD}$. This is shown in a graph 1202 in FIG. 12C. To accomplish this, the width of the input transistor 512 can be designed to be greater than the width of the pull-up transistor 516 as shown in FIG. 12A to cause the reference voltage $V_{REF}$ to be at a voltage level under the activation voltage $V_{TRIP}$ of the inverter circuit 552.

In another aspect, a write operation sensing circuit for sensing MTJ switching in an MRAM bit cell in response to a write operation is provided. The write operation sensing circuit comprises a means for pre-charging a voltage sensing output of a voltage sensing circuit to a pre-charge voltage. The voltage sensing output is coupled to a charge storage circuit, wherein the charge storage circuit is coupled to a sense line of an MRAM bit cell having a bit cell voltage, in response to a write operation signal indicating a pre-charge operation phase for a write operation to the MRAM bit cell. An example of the means for pre-charging a voltage sensing output of a voltage sensing circuit to a pre-charge voltage is the pre-charge control circuit 530 in FIG. 5B. The write operation sensing circuit also comprises a means for storing a differential voltage between the pre-charge voltage and the bit cell voltage as a first reference voltage, in response to the write operation signal indicating the pre-charge operation phase. An example of the means for storing a differential voltage between the pre-charge voltage and the bit cell voltage as a first reference voltage is the charge storage circuit 526 in FIG. 5A. The write operation sensing circuit also comprises a means for coupling the pre-charge voltage on the voltage sensing output to an input control circuit of a sense amplifier to cause the input control circuit to be activated outside its sub-threshold region, in response to the write operation signal indicating the pre-charge operation phase. An example of the means for coupling the pre-charge voltage on the voltage sensing output to an input control circuit of a sense amplifier to cause the input control circuit to be activated outside its sub-threshold region is the voltage sensing output 506 in FIG. 5A. The write operation sensing circuit also comprises a means for pre-charging a first sense amplifier output of the sense amplifier to a sense amplifier reference voltage, in response to the write operation signal indicating the pre-charge operation phase. An example of the means for pre-charging a first sense amplifier output of the sense amplifier to a sense amplifier reference voltage is the second pre-charge control circuit 548 in FIG. 5A. The write operation sensing circuit also comprises a means for discontinuing the means for pre-charging the voltage sensing output to the pre-charge voltage, in response to the write operation signal indicating a write operation phase for the write operation to the MRAM bit cell. An example of the means for discontinuing the means for pre-charging the voltage sensing output to the pre-charge voltage is the pre-charge control circuit 530 in FIG. 5A. The write operation sensing circuit also comprises a means for capacitively coupling the charge storage circuit to a sense output voltage to decrease the pre-charge voltage on the voltage sensing output in response to a decrease in the bit cell voltage on the sense line in response to a memory state switching in the MRAM bit cell for the write operation, in response to the write operation signal indicating the write operation phase. An example of the means for capacitively coupling the charge storage circuit to a sense output voltage to decrease the pre-charge voltage on the voltage sensing output in response to a decrease in the bit cell voltage on the sense line in response to a memory state switching in the MRAM bit cell for the write operation is the charge storage circuit 526 and the pre-charge control circuit 530 in FIG. 5A. The write operation sensing circuit also comprises a means for discontinuing the means for pre-charging the first sense amplifier output of the sense amplifier to the sense amplifier reference voltage, in response to the write operation signal indicating the write operation phase. An example of the means for discontinuing the means for pre-charging the first sense amplifier output of the sense amplifier to the sense amplifier reference voltage is the second pre-charge control circuit 548 in FIG. 5A. The write operation sensing circuit also comprises a means for coupling a supply voltage rail configured to receive a supply voltage to the first sense amplifier output to divide the supply voltage with the input control circuit to generate the first sense amplifier output voltage on the first sense amplifier output in response to the write operation signal indicating the write operation phase, wherein a voltage level of the first sense amplifier output voltage on the first sense amplifier output indicates whether the memory state in the MRAM bit cell has switched for the write operation. An example of the means for coupling a supply voltage rail configured to receive a supply voltage to the first sense amplifier output to divide the supply voltage with the input control circuit to generate the first sense amplifier output voltage on the first sense amplifier output in response to the write operation signal indicating the write operation phase is the pull-up control circuit 518 and the input control circuit 514 in FIG. 5A.

OC write operation sensing circuits that include a voltage sensing circuit with a capacitive-coupling effect to sense the voltage on a sense line in an MRAM bit cell, and a sense amplifier with an OC effect to generate an output voltage indicating the switching of an MTJ in the MRAM bit cell based on the sensed voltage by the voltage sensing circuit, including but not limited to the OC write operation sensing circuit 500 in FIG. 5A, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
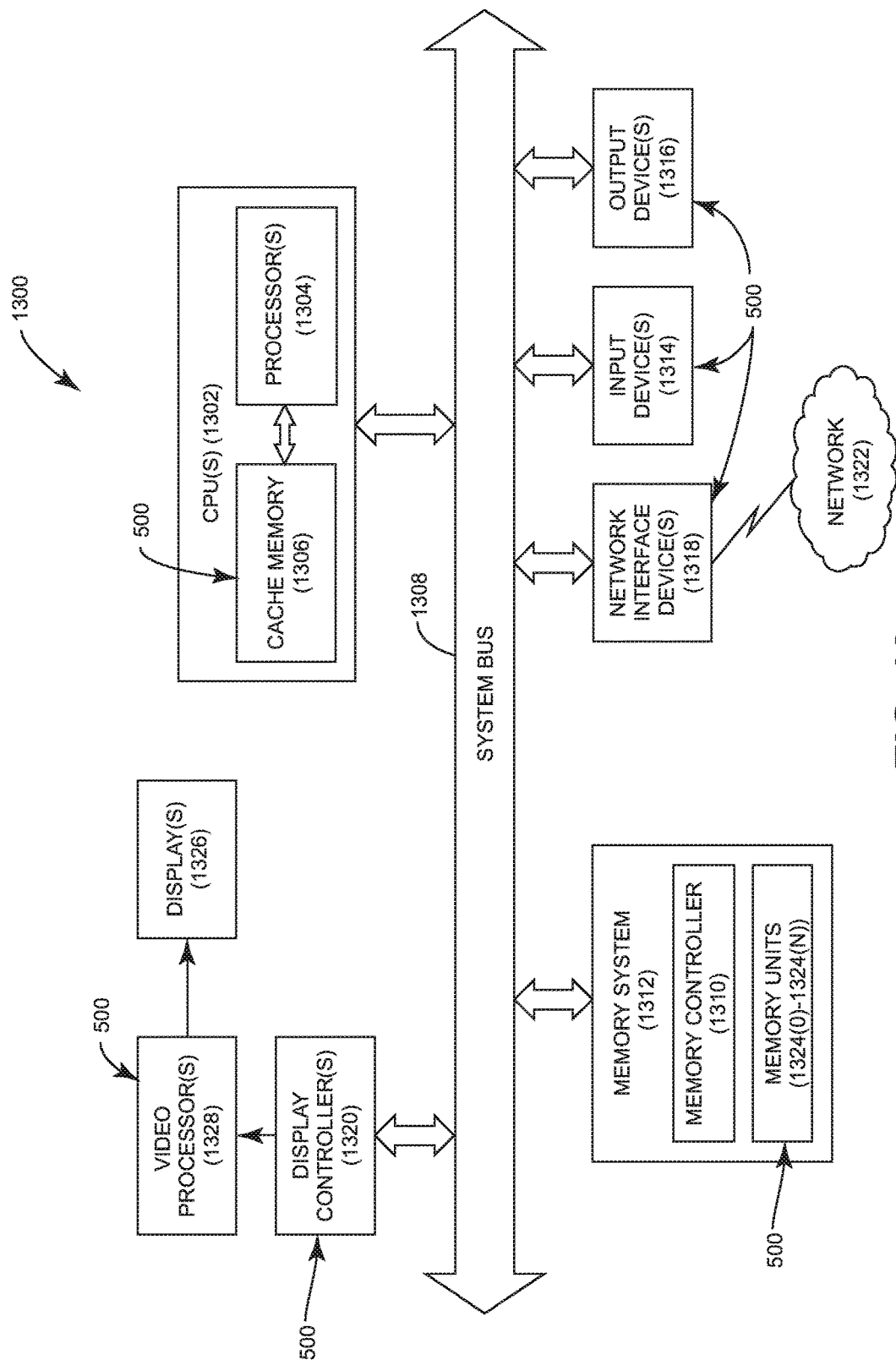
FIG. 13 is a block diagram of an exemplary processor-based system that can include an MRAM that includes an OC write operation sensing circuit for MRAM bit cells in the MRAM, including but not limited to the OC write operation sensing circuit in FIG. 5A, wherein each OC write operation sensing circuit includes a voltage sensing circuit with a capacitive-coupling effect to sense the voltage on a sense line in an MRAM bit cell, and a sense amplifier with an OC effect to generate an output voltage indicating the switching of an MTJ in the MRAM bit cell based on the sensed voltage by the voltage sensing circuit.

In this regard, FIG. 13 illustrates an example of a processor-based system 1300 that can include an OC write operation sensing circuit that includes a voltage sensing circuit with a capacitive-coupling effect to sense the voltage on a sense line in an MRAM bit cell, and a sense amplifier with an OC effect to generate an output voltage indicating the switching of an MTJ in the MRAM bit cell based on the sensed voltage by the voltage sensing circuit, including but not limited to the OC write operation sensing circuit 500 in FIG. 5A. In this example, the processor-based system 1300 includes one or more central processing units (CPUs) 1302, each including one or more processors 1304. The CPU(s) 1302 may have cache memory 1306 coupled to the processor(s) 1304 for rapid access to temporarily stored data. As an example, the cache memory 1306 could include MRAM bit cells that include an OC write operation sensing circuit that includes a voltage sensing circuit with a capacitive-coupling effect to sense the voltage on a sense line in an MRAM bit cell, and a sense amplifier with an OC effect to generate an output voltage indicating the switching of an MTJ in the MRAM bit cell based on the sensed voltage by the voltage sensing circuit, including but not limited to the OC write operation sensing circuit 500 in FIG. 5A. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1312, one or more input devices 1314, one or more output devices 1316, one or more network interface devices 1318, and one or more display controllers 1320, as examples. Each of the memory system 1312, the one or more input devices 1314, the one or more output devices 1316, the one or more network interface devices 1318, and the one or more display controllers 1320 can be MRAM bit cells that include an OC write operation sensing circuit that includes a voltage sensing circuit with a capacitive-coupling effect to sense the voltage on a sense line in an MRAM bit cell, and a sense amplifier with an OC effect to generate an output voltage indicating the switching of an MTJ in the MRAM bit cell based on the sensed voltage by the voltage sensing circuit, including but not limited to the OC write operation sensing circuit 500 in FIG. 5A. The input device(s) 1314 can include any type of input device, including, but not limited to, input keys, switches, voice processors, etc. The output device(s) 1316 can include any type of output device, including, but not limited to, audio, video, other visual indicators, etc. The network interface device(s) 1318 can be any device configured to allow exchange of data to and from a network 1322. The network 1322 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1318 can be configured to support any type of communications protocol desired. The memory system 1312 can include one or more memory units 1324(0)-1324(N).

The CPU(s) 1302 may also be configured to access the display controller(s) 1320 over the system bus 1308 to control information sent to one or more displays 1326. The display controller(s) 1320 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc. The display controller(s) 1320, display(s) 1326, and/or the video processor(s) 1328 can include MRAM bit cells that include an OC write operation sensing circuit that includes a voltage sensing circuit with a capacitive-coupling effect to sense the voltage on a sense line in an MRAM bit cell, and a sense amplifier with an OC effect to generate an output voltage indicating the switching of an MTJ in the MRAM bit cell based on the sensed voltage by the voltage sensing circuit, including but not limited to the OC write operation sensing circuit 500 in FIG. 5A.

Figure 14:
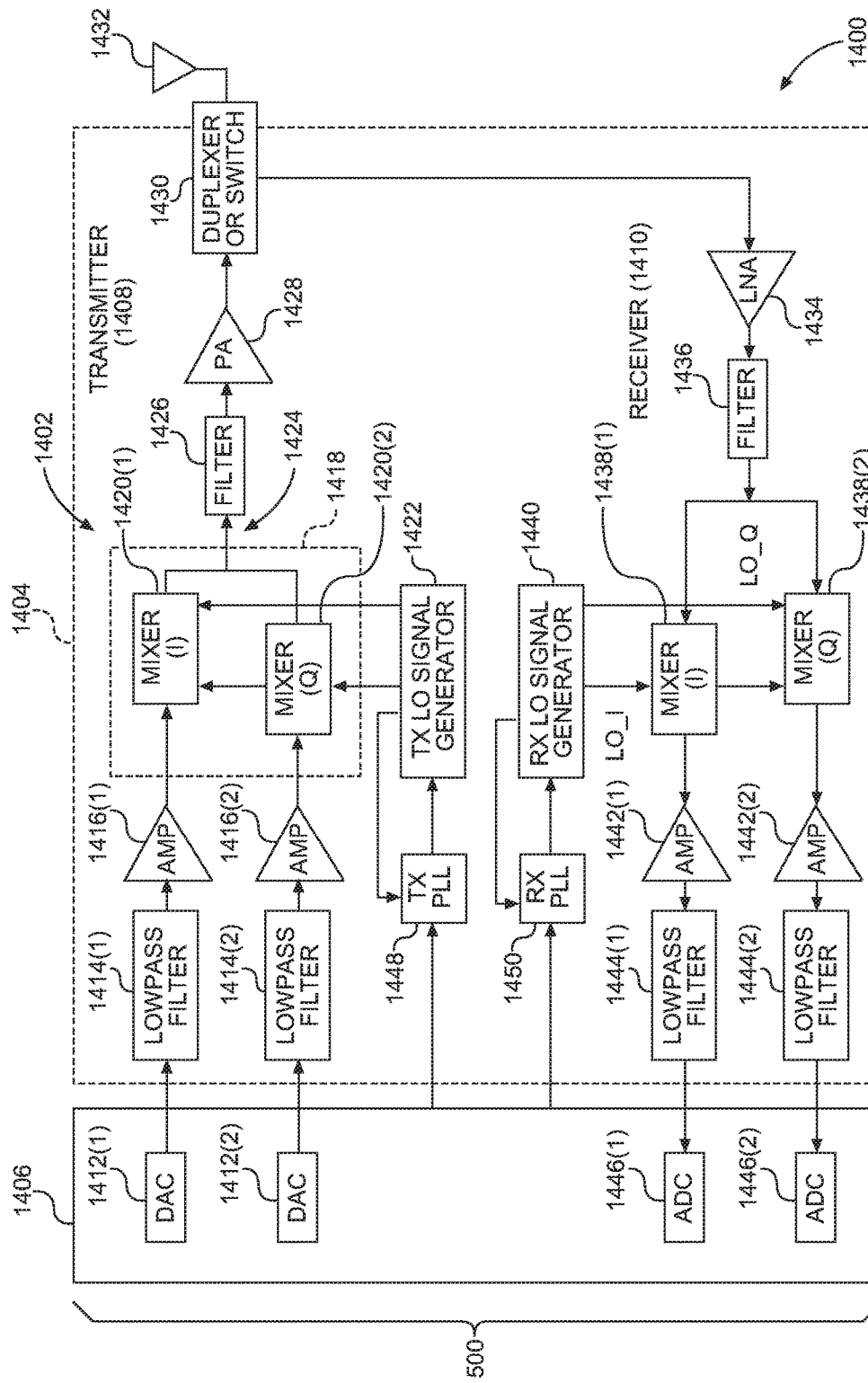
FIG. 14 is a block diagram of an exemplary wireless communications device that includes radio frequency (RF) components formed in an integrated circuit (IC), wherein any of the components therein can include an MRAM that includes an OC write operation sensing circuit for MRAM bit cells in the MRAM, including but not limited to the OC write operation sensing circuit in FIG. 5A, wherein each OC write operation sensing circuit includes a voltage sensing circuit with a capacitive-coupling effect to sense the voltage on a sense line in an MRAM bit cell, and a sense amplifier with an OC effect to generate an output voltage indicating the switching of an MTJ in the MRAM bit cell based on the sensed voltage by the voltage sensing circuit.

FIG. 14 illustrates an exemplary wireless communications device 1400 that includes radio frequency (RF) components formed in an integrated circuit (IC) 1402, wherein any of the components therein can include MRAM bit cells that include an OC write operation sensing circuit that includes a voltage sensing circuit with a capacitive-coupling effect to sense the voltage on a sense line in an MRAM bit cell, and a sense amplifier with an OC effect to generate an output voltage indicating the switching of an MTJ in the MRAM bit cell based on the sensed voltage by the voltage sensing circuit, including but not limited to the OC write operation sensing circuit 500 in FIG. 5A. In this regard, the wireless communications device 1400 may be provided in the IC 1402. The wireless communications device 1400 may include or be provided in any of the above referenced devices, as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communications. In general, the wireless communications device 1400 may include any number of transmitters 1408 and/or receivers 1410 for any number of communication systems and frequency bands. All or a portion of the transceiver 1404 may be implemented on one or more analog ICs, RF ICs (RFICs), mixed-signal ICs, etc.

The transmitter 1408 or the receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1410. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog converters (DACs) 1412(1), 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired signals caused by the prior digital-to-analog conversion. Amplifiers (AMP) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals through mixers 1420(1), 1420(2) from a TX LO signal generator 1422 to provide an upconverted signal 1424. A filter 1426 filters the upconverted signal 1424 to remove undesired signals caused by the frequency upconversion as well as noise in a receive frequency band. A power amplifier (PA) 1428 amplifies the upconverted signal 1424 from the filter 1426 to obtain the desired output power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Down-conversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by amplifiers (AMP) 1442(1), 1442(2) and further filtered by lowpass filters 1444(1), 1444(2) to obtain I and Q analog input signals, which are provided to the data processor 1406. In this example, the data processor 1406 includes ADCs 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A write operation sensing circuit for sensing magnetic tunnel junction (MTJ) switching in a magneto-resistive random access memory (MRAM) bit cell in response to a write operation, comprising:
   a voltage sensing circuit, comprising:
      a voltage sensing input configured to be coupled to a sense line of an MRAM bit cell, the voltage sensing input configured to receive a bit cell voltage on the sense line;
      a voltage sensing output coupled to a sense amplifier input of a sense amplifier, the voltage sensing output configured to receive a sense output voltage;
      a charge storage circuit coupled to the voltage sensing input and the voltage sensing output; and
      a pre-charge control circuit coupled to the voltage sensing output and a pre-charge voltage input configured to receive a pre-charge voltage; and
   the sense amplifier, comprising:
      the sense amplifier input;
      a first sense amplifier output configured to receive a first sense amplifier output voltage;
      an input control circuit coupled to the sense amplifier input and the first sense amplifier output, the input control circuit configured to receive the sense output voltage;
      a pull-up control circuit coupled to a reference voltage input configured to receive a sense amplifier reference voltage, a supply voltage rail configured to receive a supply voltage, and the first sense amplifier output;

a second charge storage circuit coupled to the reference voltage input; and a second pre-charge control circuit coupled to a gate of the pull-up control circuit and the reference voltage input.

2. The write operation sensing circuit of claim 1, wherein, in response to a write operation signal indicating a pre-charge operation phase for the write operation:

the pre-charge control circuit is configured to pre-charge the sense output voltage on the voltage sensing output to the pre-charge voltage; and the charge storage circuit is configured to store a differential voltage between the pre-charge voltage and the bit cell voltage on the sense line as a first reference voltage; and the second pre-charge control circuit is configured to couple the reference voltage input to the first sense amplifier output to pre-charge the first sense amplifier output to the first sense amplifier output voltage of the sense amplifier reference voltage.

3. The write operation sensing circuit of claim 2, wherein the pre-charge voltage causes the input control circuit of the sense amplifier to operate outside its sub-threshold region.

4. The write operation sensing circuit of claim 2, wherein, in response to the write operation signal indicating the pre-charge operation phase for the write operation:

the pre-charge control circuit is configured to be decoupled from the voltage sensing output;

the charge storage circuit is configured to be capacitively coupled to the voltage sensing output to decrease the pre-charge voltage on the voltage sensing output in response to a decrease in the bit cell voltage on the sense line in response to a memory state switching in the MRAM bit cell for the write operation;

the second pre-charge control circuit is configured to decouple the reference voltage input from the first sense amplifier output; and the pull-up control circuit is configured to couple the supply voltage rail to the first sense amplifier output to divide the supply voltage with the input control circuit as the first sense amplifier output voltage on the first sense amplifier output.

5. The write operation sensing circuit of claim 4, wherein, in response to the decrease in the bit cell voltage on the sense line in response to the memory state switching in the MRAM bit cell for the write operation, the input control circuit is configured to reduce current flowing through the input control circuit to cause current flowing through the pull-up control circuit to increase the first sense amplifier output voltage on the first sense amplifier output.

6. The write operation sensing circuit of claim 1, wherein the pre-charge control circuit comprises a pass gate coupled between the pre-charge voltage input and the voltage sensing output.

7. The write operation sensing circuit of claim 1, wherein the charge storage circuit comprises a capacitor circuit.

8. The write operation sensing circuit of claim 1, wherein the voltage sensing input is configured to be coupled to the sense line comprising a bit line of the MRAM bit cell.

9. The write operation sensing circuit of claim 1, wherein the input control circuit comprises an input transistor comprising a gate coupled to the sense amplifier input, and a source/drain coupled to the first sense amplifier output.

10. The write operation sensing circuit of claim 9, wherein the input transistor comprises an N-type metal-oxide semi-conductor (MOS) (NMOS) transistor.

11. The write operation sensing circuit of claim 1, wherein the pull-up control circuit comprises a pull-up transistor comprising a gate coupled to the reference voltage input configured to receive the sense amplifier reference voltage, a source/drain coupled to the supply voltage rail, and a drain/source coupled to the first sense amplifier output.

12. The write operation sensing circuit of claim 11, wherein the pull-up transistor comprises a P-type MOS (PMOS) transistor.

13. The write operation sensing circuit of claim 1, wherein the second charge storage circuit comprises a second capacitor circuit.

14. The write operation sensing circuit of claim 1, further comprising an inverter circuit comprising an inverter input coupled to the first sense amplifier output and a second sense amplifier output, the inverter circuit configured to generate an inverted second sense amplifier output voltage based on a voltage level of the first sense amplifier output voltage activating the inverter circuit in response to the memory state switching in the MRAM bit cell for the write operation.

15. The write operation sensing circuit of claim 14, further comprising a write termination circuit comprising a first input coupled to the second sense amplifier output and a second input coupled to a word line carrying a word line signal indicating a write operation state, the write termination circuit configured to generate a write enable signal based on the second sense amplifier output voltage and the word line signal.

16. The write operation sensing circuit of claim 15, wherein the sense amplifier further comprises a sense amplifier enable control circuit coupled to the input control circuit, the sense amplifier enable control circuit configured to enable the input control circuit in response to the write enable signal indicating a write enable state.

17. The write operation sensing circuit of claim 1 integrated into an integrated circuit (IC).

18. The write operation sensing circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A write operation sensing circuit for sensing magnetic tunnel junction (MTJ) switching in a magneto-resistive random access memory (MRAM) bit cell in response to a write operation, comprising:

a means for pre-charging a voltage sensing output of a voltage sensing circuit to a pre-charge voltage, the voltage sensing output coupled to a charge storage circuit, and wherein the charge storage circuit is coupled to a sense line of an MRAM bit cell having a bit cell voltage, in response to a write operation signal indicating a pre-charge operation phase for a write operation to the MRAM bit cell;

a means for storing a differential voltage between the pre-charge voltage and the bit cell voltage as a first reference voltage, in response to the write operation signal indicating the pre-charge operation phase;

a means for coupling the pre-charge voltage on the voltage sensing output to an input control circuit of a sense amplifier to cause the input control circuit to be activated outside its sub-threshold region, in response to the write operation signal indicating the pre-charge operation phase;

a means for pre-charging a first sense amplifier output of the sense amplifier to a sense amplifier reference voltage, in response to the write operation signal indicating the pre-charge operation phase;

a means for discontinuing the means for pre-charging the voltage sensing output to the pre-charge voltage, in response to the write operation signal indicating the write operation phase for a write operation to the MRAM bit cell;

a means for capacitively coupling the charge storage circuit to a sense output voltage to decrease the pre-charge voltage on the voltage sensing output in response to a decrease in the bit cell voltage on the sense line in response to a memory state switching in the MRAM bit cell for the write operation, in response to the write operation signal indicating the write operation phase;

a means for discontinuing the means for pre-charging the first sense amplifier output of the sense amplifier to the sense amplifier reference voltage, in response to the write operation signal indicating the write operation phase; and a means for coupling a supply voltage rail configured to receive a supply voltage to the first sense amplifier output to divide the supply voltage with the input control circuit to generate the first sense amplifier output voltage on the first sense amplifier output in response to the write operation signal indicating the write operation phase, wherein a voltage level of the first sense amplifier output voltage on the first sense amplifier output indicates whether the memory state in the MRAM bit cell has switched for the write operation.

20. A method of sensing magnetic tunnel junction (MTJ) switching in a magneto-resistive random access memory (MRAM) bit cell in response to a write operation, comprising:

in response to a write operation signal indicating a pre-charge operation phase for a write operation to an MRAM bit cell:
pre-charging a voltage sensing output of a voltage sensing circuit to a pre-charge voltage, the voltage sensing output coupled to a charge storage circuit, and wherein the charge storage circuit is coupled to a sense line of the MRAM bit cell having a bit cell voltage;
storing a differential voltage between the pre-charge voltage and the bit cell voltage as a first reference voltage in the charge storage circuit;
coupling the pre-charge voltage on the voltage sensing output to an input control circuit of a sense amplifier to cause the input control circuit to be activated outside its sub-threshold region; and
pre-charging a first sense amplifier output of the sense amplifier to a sense amplifier reference voltage; and in response to the write operation signal indicating a write operation phase for the write operation to the MRAM bit cell:
decoupling a pre-charge control circuit from the voltage sensing output;
capacitively coupling the charge storage circuit to a sense output voltage to decrease the pre-charge voltage on the voltage sensing output in response to a decrease in the bit cell voltage on the sense line in response to a memory state switching in the MRAM bit cell for the write operation;
discontinuing pre-charging of the first sense amplifier output of the sense amplifier to the sense amplifier reference voltage; and
coupling a supply voltage rail configured to receive a supply voltage to the first sense amplifier output to divide the supply voltage with the input control circuit to generate the first sense amplifier output voltage on the first sense amplifier output, wherein a voltage level of the first sense amplifier output voltage on the first sense amplifier output indicates whether the memory state in the MRAM bit cell has switched for the write operation.

21. The method of claim 20, further comprising reducing current flowing through the input control circuit to cause current flowing through a pull-up control circuit to increase the first sense amplifier output voltage on the first sense amplifier output, in response to the decrease in the bit cell voltage on the sense line in response to the memory state switching in the MRAM bit cell for the write operation.

22. The method of claim 20, further comprising:
coupling the first sense amplifier output voltage on the first sense amplifier output to an inverter circuit coupled to the first sense amplifier output and a second sense amplifier output; and
generating an inverted second sense amplifier output voltage based on the voltage level of the first sense amplifier output voltage activating the inverter circuit in response to the memory state switching in the MRAM bit cell for the write operation.

23. The method of claim 22, further comprising generating a write enable signal based on the inverted second sense amplifier output voltage and a word line signal indicating the write operation.

24. A magneto-resistive random access memory (MRAM), comprising:
a plurality of MRAM bit cells, each comprising:
an access transistor comprising a gate node coupled to a word line, a first access node, and a second access node coupled to a source line; and
a magnetic tunnel junction (MTJ) coupled between a bit line and the first access node of the access transistor; and
a plurality of write operation sensing circuits each coupled to an MRAM bit cell among the plurality of MRAM bit cells, and each comprising:
a voltage sensing circuit, comprising:
a voltage sensing input configured to be coupled to a sense line of the MRAM bit cell, the voltage sensing input configured to receive a bit cell voltage on the sense line;
a voltage sensing output coupled to a sense amplifier input of a sense amplifier, the voltage sensing output configured to receive a sense output voltage;
a charge storage circuit coupled to the voltage sensing input and the voltage sensing output; and a pre-charge control circuit coupled to the voltage sensing output and a pre-charge voltage input configured to receive a pre-charge voltage; and the sense amplifier, comprising:
  the sense amplifier input;
  a first sense amplifier output configured to receive a first sense amplifier output voltage;
  an input control circuit coupled to the sense amplifier input and the first sense amplifier output, the input control circuit configured to receive the sense output voltage;
  a pull-up control circuit coupled to a reference voltage input configured to receive a sense amplifier reference voltage, a supply voltage rail configured to receive a supply voltage, and the first sense amplifier output;
  a second charge storage circuit coupled to the reference voltage input; and
  a second pre-charge control circuit coupled to a gate of the pull-up control circuit and the reference voltage input.

25. The MRAM of claim 24, wherein, in response to a write operation signal indicating a pre-charge operation phase for a write operation:
  the pre-charge control circuit is configured to pre-charge the sense output voltage on the voltage sensing output to the pre-charge voltage;
  the charge storage circuit is configured to store a differential voltage between the pre-charge voltage and the bit cell voltage on the sense line as a first reference voltage; and
  the second pre-charge control circuit is configured to couple the reference voltage input to the first sense amplifier output to pre-charge the first sense amplifier output to the first sense amplifier output voltage of the sense amplifier reference voltage.

26. The MRAM of claim 25, wherein the pre-charge voltage causes the input control circuit of the sense amplifier to operate outside its sub-threshold region.

27. The MRAM of claim 25, wherein, in response to the write operation signal indicating the pre-charge operation phase for the write operation:

the pre-charge control circuit is configured to be decoupled from the voltage sensing output;

the charge storage circuit is configured to be capacitively coupled to the voltage sensing output to decrease the pre-charge voltage on the voltage sensing output in response to a decrease in the bit cell voltage on the sense line in response to a memory state switching in the MRAM bit cell for the write operation;

the second pre-charge control circuit is configured to decouple the reference voltage input from the first sense amplifier output; and the pull-up control circuit is configured to couple the supply voltage rail to the first sense amplifier output to divide the supply voltage with the input control circuit as the first sense amplifier output voltage on the first sense amplifier output.

28. The MRAM of claim 27, wherein, in response to the decrease in the bit cell voltage on the sense line in response to the memory state switching in the MRAM bit cell for the write operation, the input control circuit of the sense amplifier of each of the plurality of write operation sensing circuits is configured to reduce current flowing through the input control circuit to cause current flowing through the pull-up control circuit to increase the first sense amplifier output voltage on the first sense amplifier output.

29. The MRAM of claim 24, wherein at least one write operation sensing circuit among the plurality of write operation sensing circuits further comprises an inverter circuit comprising an inverter input coupled to the first sense amplifier output and a second sense amplifier output, the inverter circuit configured to generate an inverted second sense amplifier output voltage based on a voltage level of the first sense amplifier output voltage activating the inverter circuit in response to a memory state switching in the MRAM bit cell for a write operation.

30. The MRAM of claim 29, further comprising a write termination circuit comprising a first input coupled to the second sense amplifier output and a second input coupled to a word line carrying a word line signal indicating a write operation state, the write termination circuit configured to generate a write enable signal based on the second sense amplifier output voltage and the word line signal.

* * * * *